United States Patent
Na et al.

(10) Patent No.: US 11,282,678 B2
(45) Date of Patent: Mar. 22, 2022

(54) METHOD OF CONTROLLING UNIFORMITY OF PLASMA AND PLASMA PROCESSING SYSTEM

(71) Applicant: SAMSUNG ELECTRONICS CO., LTD., Suwon-si (KR)

(72) Inventors: Dong-Hyeon Na, Hwaseong-si (KR); Seung-Bo Shim, Seoul (KR); Ha-Dong Jin, Hwaseong-si (KR); Min-Young Hur, Suwon-si (KR); Kyo-Hyeok Kim, Seoul (KR); Jong-Woo Sun, Hwaseong-si (KR); Jae-Hyun Lee, Yongin-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 83 days.

(21) Appl. No.: 16/535,801

(22) Filed: Aug. 8, 2019

(65) Prior Publication Data
US 2020/0227240 A1 Jul. 16, 2020

(30) Foreign Application Priority Data

Jan. 10, 2019 (KR) .......................... 10-2019-0003048

(51) Int. Cl.
*H01J 37/32* (2006.01)
*H03H 7/38* (2006.01)

(52) U.S. Cl.
CPC .. *H01J 37/32183* (2013.01); *H01J 37/32137* (2013.01); *H03H 7/38* (2013.01)

(58) Field of Classification Search
CPC ........... H01J 37/32183; H01J 37/32137; H01J 37/32165; H01J 37/32146; H01J 37/32091; H01J 37/32082; H01J 37/32155; H01J 37/32174; H01J 2237/3343; H03H 7/38; H01L 21/67069
See application file for complete search history.

(56) References Cited

U.S. PATENT DOCUMENTS 8,080,479 B2   12/2011   Collins et al.
8,237,517 B2   8/2012    Shannon et al.
8,692,467 B2   4/2014    Benjamin et al.
(Continued)

FOREIGN PATENT DOCUMENTS

KR   10-2018-0052772   5/2018

*Primary Examiner* — Borna Alaeddini
(74) *Attorney, Agent, or Firm* — F. Chau & Associates, LLC

(57) ABSTRACT

According to a method of controlling uniformity of plasma, a first RF driving pulse signal including first RF pulses is generated by pulsing a first RF signal having a first frequency, and a second RF driving pulse signal including second RF pulses is generated by pulsing a second RF signal having a second, lower frequency. The first and second RF driving signals are applied to a top electrode and/or a bottom electrode of a plasma chamber. A harmonic control signal including harmonic control pulses is generated based on timing of the first and second RF pulses. A harmonic component of the first and second RF driving pulse signals is reduced via intermittent activation and deactivation of a harmonic control circuit as controlled by the harmonic control signal. The uniformity of plasma is improved through the control based on timings of the RF driving pulses.

20 Claims, 21 Drawing Sheets

(56) References Cited

U.S. PATENT DOCUMENTS

| | | | |
|---|---|---|---|
| 8,952,765 B2 | 2/2015 | Fisk, II et al. | |
| 9,502,217 B2 | 11/2016 | Kanazawa et al. | |
| 9,754,767 B2 | 9/2017 | Kawasaki | |
| 9,761,414 B2 | 9/2017 | Marakhtanov et al. | |
| 9,788,405 B2 | 10/2017 | Kawasaki et al. | |
| 10,043,637 B2* | 8/2018 | Suzuki | H01J 37/3244 |
| 10,869,712 B2* | 12/2020 | Friedrichs | A61B 18/1445 |
| 2008/0236750 A1* | 10/2008 | Koshimizu | H01J 37/32165 156/345.38 |
| 2009/0223933 A1* | 9/2009 | Iwata | H01J 37/32091 216/67 |
| 2014/0263199 A1 | 9/2014 | Nelson et al. | |
| 2017/0099722 A1* | 4/2017 | Kawasaki | H01J 37/32146 |
| 2018/0061663 A1 | 3/2018 | Chandrashekar et al. | |

* cited by examiner

METHOD OF CONTROLLING UNIFORMITY OF PLASMA AND PLASMA PROCESSING SYSTEM

CROSS-REFERENCE TO RELATED APPLICATION

This U.S. non-provisional application claims priority under 35 USC § 119 to Korean Patent Application No. 10-2019-0003048, filed on Jan. 10, 2019, in the Korean Intellectual Property Office (KIPO), the disclosure of which is incorporated by reference herein in its entirety.

TECHNICAL FIELD

Example embodiments relate generally to semiconductor manufacturing processes, and more particularly to methods of controlling uniformity of plasma and plasma processing systems.

DISCUSSION OF THE RELATED ART

Semiconductor manufacturing processes using plasma rely on effective plasma control to achieve requisite quality and manufacturing objectives. With a typical plasma based semiconductor process, radio frequency (RF) power of two different frequencies is used to independently control ion energy and plasma density, respectively. The RF power is applied in pulses to improve an etching rate and an etching profile. When the RF source power of a high frequency is applied to increase the etching rate, this may cause a center-high skewed power distribution as a result of harmonic energy generated due to nonlinearity of the plasma load. (The plasma does not behave like a linear ohmic resistor.) The uniformity of plasma may be improved by removing the harmonic energy via harmonic control circuitry. Such circuitry however, may cause power loss with respect to a fundamental frequency of the RF source power, reducing the etching rate.

SUMMARY

Example embodiments of the inventive concept may provide a method of controlling uniformity of plasma and a plasma processing system, capable of efficiently improving plasma characteristics.

According to example embodiments, a method of controlling uniformity of plasma, includes, generating a first radio frequency (RF) driving pulse signal including first RF pulses by pulsing a first RF signal having a first frequency, generating a second RF driving pulse signal including second RF pulses by pulsing a second RF signal having a second frequency lower than the first frequency, applying the first RF driving signal and the second RF driving signal to at least one of a top electrode and a bottom electrode of a plasma chamber, generating a harmonic control signal including harmonic control pulses based on timings of the first RF pulses and the second RF pulses, and reducing a harmonic component of the first RF driving pulse signal and the second RF driving pulse signal via intermittent activation and deactivation of a harmonic control circuit as controlled by the harmonic control signal.

According to example embodiments, a plasma processing system include a plasma chamber including a top electrode and a bottom electrode, a first RF power supplier, a second RF power supplier, a controller and a harmonic control circuit. The first RF power supplier generates a first radio frequency (RF) driving pulse signal including first RF pulses by pulsing a first RF signal having a first frequency to apply the first RF driving pulse signal to at least one of the top electrode and the bottom electrode. The second RF power supplier generates a second RF driving pulse signal including second RF pulses by pulsing a second RF signal having a second frequency lower than the first frequency to apply the second RF driving pulse signal to at least one of the top electrode and the bottom electrode. The controller generates a harmonic control signal including harmonic control pulses based on timings of the first RF pulses and the second RF pulses. The harmonic control circuit is connected between at least one of the first RF power supplier and the second RF power supplier and at least one of the top electrode and the bottom electrode. The harmonic control circuit is driven based on the harmonic control signal to reduce a harmonic component of the first RF driving pulse signal and the second RF driving pulse signal.

According to example embodiments, a method of controlling uniformity of plasma, includes, generating a first radio frequency (RF) driving pulse signal including first RF pulses by pulsing a first RF signal having a first frequency, generating a second RF driving pulse signal including second RF pulses by pulsing a second RF signal having a second frequency lower than the first frequency, generating a third RF driving pulse signal including third RF pulses by pulsing a third RF signal having a third frequency lower than the first frequency and higher than the second frequency, and applying the first RF driving signal, the second RF driving signal and the third RF driving pulse signal to at least one of a top electrode and a bottom electrode of a plasma chamber. The third frequency is lower than a ion plasma frequency, which is a unique frequency of an ion in plasma.

The method of controlling uniformity of plasma and the plasma processing system according to example embodiments may improve uniformity of plasma while realizing a desired etching rate, i.e., preventing an excessive reduction in the etching rate by controlling the harmonic wave based on timings of the RF driving pulses. In addition, the method of controlling uniformity of plasma and the plasma processing system according to example embodiments may improve uniformity of plasma by controlling the ion energy using an efficient frequency combination.

BRIEF DESCRIPTION OF THE DRAWINGS

Example embodiments of the present disclosure will be more clearly understood from the following detailed description taken in conjunction with the accompanying drawings.

DETAILED DESCRIPTION OF EMBODIMENTS

Figure 1:
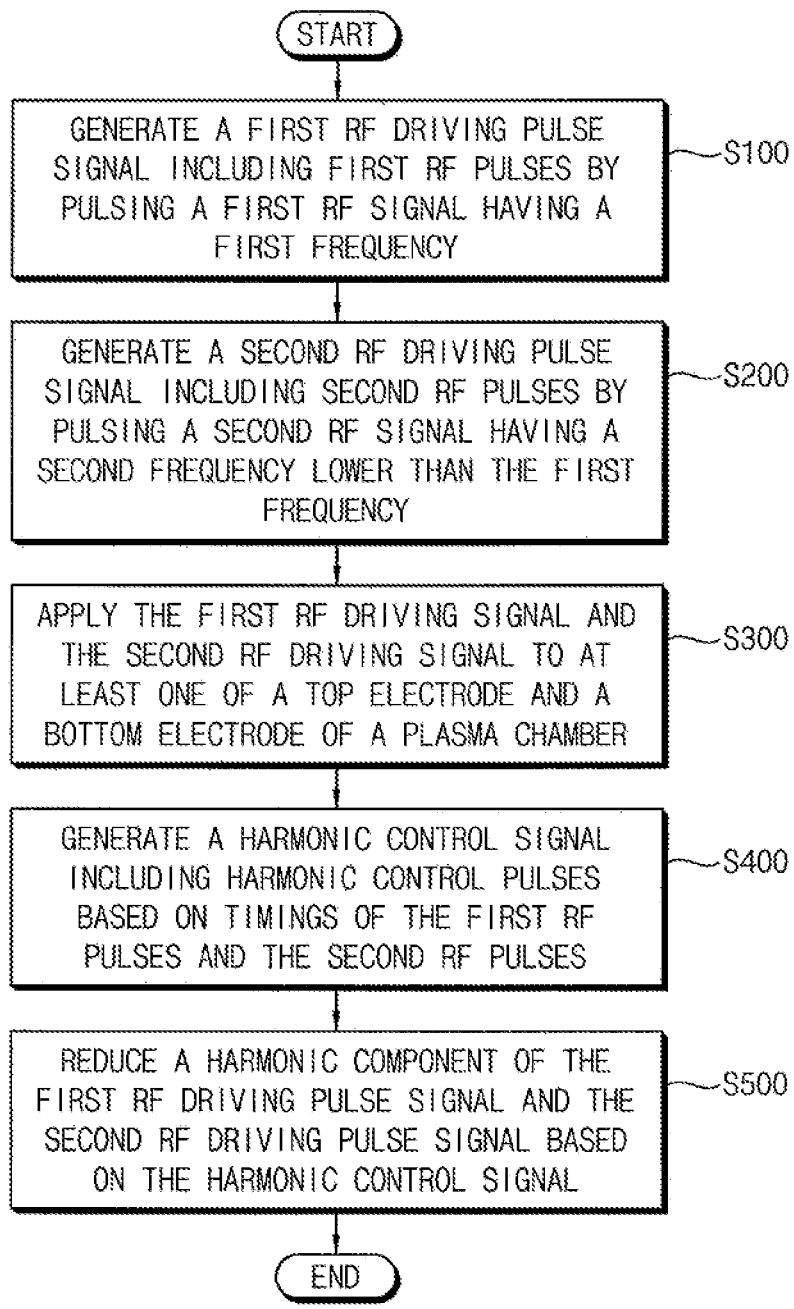
FIG. 1 is a flow chart illustrating a method of controlling uniformity of plasma according to example embodiments.

Various example embodiments will be described more fully hereinafter with reference to the accompanying drawings, in Which some example embodiments are shown. In the drawings, like numerals refer to like elements throughout, and redundant descriptions of elements may be omitted.

FIG. 1 is a flow chart illustrating a method of controlling uniformity of plasma in plasma-based processing according to example embodiments. As shown in FIG. 1, a first radio frequency (RF) driving pulse signal including first RF pulses is generated by pulsing a first RF signal having a first frequency (S100), and a second RF driving pulse signal including second RF pulses is generated by pulsing a second RF signal having a second frequency lower than the first frequency (S200). The first frequency is relatively high for controlling plasma density and the second frequency is relatively low for controlling ion energy. For example, the first frequency may be higher than 40 MHz and the second frequency may be lower than 600 kHz.

The first RF driving signal and the second RF driving signal are applied to at least one of a top electrode and a bottom electrode of a plasma chamber (S300). Various configurations for applying the first RF driving pulse signal and the second RF driving pulse signal may be implemented as will be described below with reference to FIGS. 9A through 9D.

A harmonic control signal including harmonic control pulses is generated based on timings of the first RF pulses and the second RF pulses (S400). As will be described below, to reduce degradation of the etching rate, which is due to a loss of RF power transferred through the first and second RF driving pulse signals, the timing of the harmonic control pulses may be controlled based on overlapping periods of the first RF pulses and the second RF pulses.

A harmonic component of the first RF driving pulse signal and the second RF driving pulse signal is reduced based on the harmonic control signal (S500). The reduction of the harmonic component (interchangeably, "harmonic energy" or "harmonic wave") may be implemented using a harmonic control circuit to provide a leakage path of the harmonic component as will be described below. The leakage path may result in dissipation of the harmonic energy. With the harmonic control described herein, instead of continually activating the harmonic control circuit during all periodic time intervals of the first and second RF pulses, the harmonic control circuit may be deactivated during a portion (e.g., a minority portion) of at least one of these periodic time intervals. In this manner, reduction in RF power applied to the plasma chamber at the fundamental frequencies due to the harmonic suppression is lessened, such that the etching rate is not significantly impacted. The times that the harmonic control circuit is deactivated may coincide with times that the harmonic energy is unstable.

As such, the method of controlling uniformity of plasma and the plasma processing system according to example embodiments may improve uniformity of plasma while attaining a desired etching rate by controlling harmonic energy based on the timing of the RF driving pulses.

Figure 2:
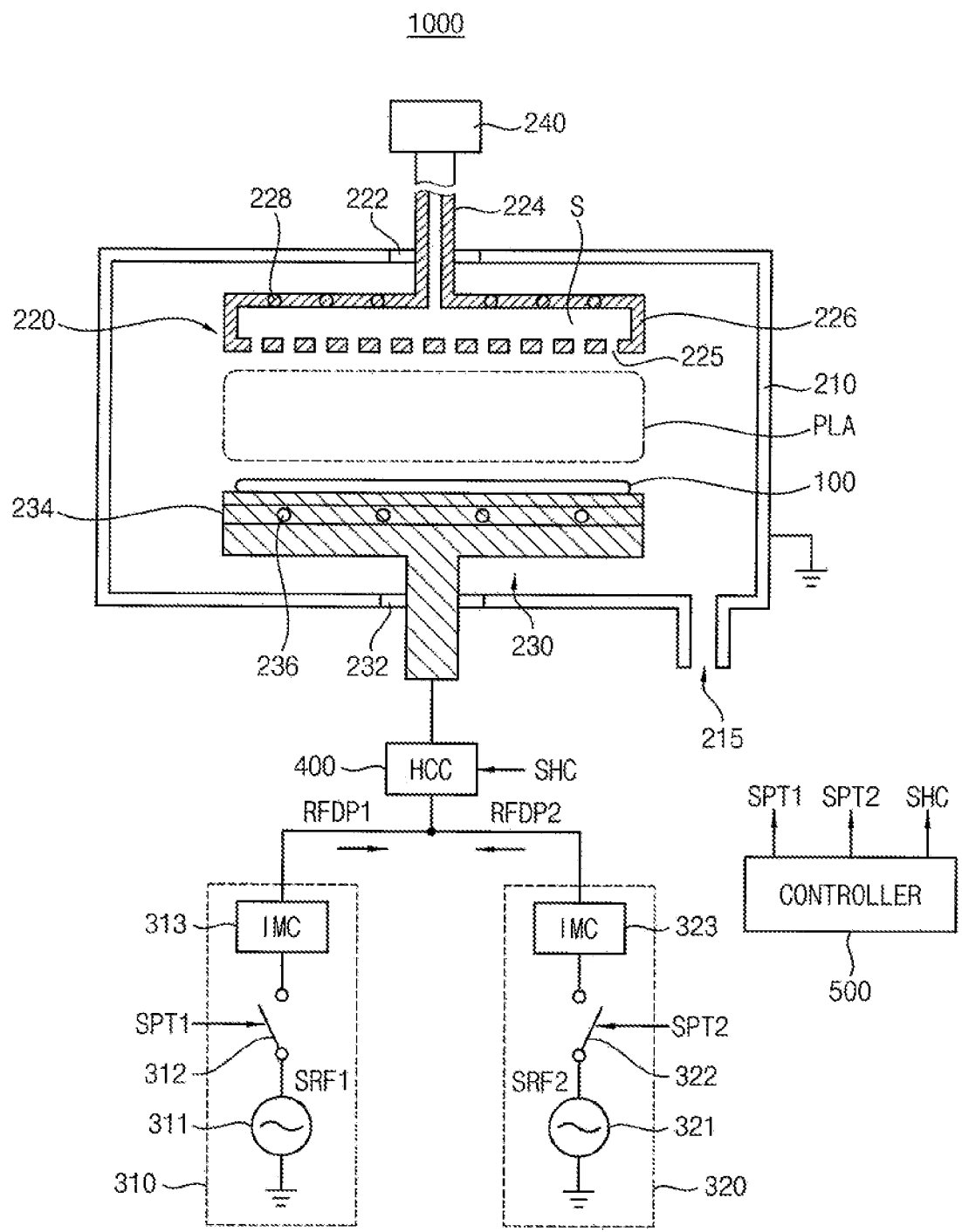
FIG. 2 is a block diagram illustrating a plasma processing system according to example embodiments.

FIG. 2 is a block diagram illustrating a plasma processing system 1000 according to example embodiments. The plasma processing system 1000 may include a plasma chamber 210 in which an etching process using plasma PLA is performed, a source supplier 220 disposed at an upper portion of the plasma chamber 210, a substrate holder 230 disposed at a lower portion of the plasma chamber 210 to mount a substrate 100 to be processed, a first RF power supplier 310 and a second RF power supplier 320 to provide RF power for generating plasma in the plasma chamber 210, a harmonic control circuit HCC 400 and a controller 500.

As an example, the plasma chamber 210 may include a hollow metal body having sufficient electrical conductivity, rigidity and stiffness such that the plasma etching process may be performed inside the hollow metal body.

A source tube in which the source gases for the etching process flows may penetrate through an upper portion of the plasma chamber 210 and a protrusion portion of the substrate holder 230 may penetrate through a bottom portion of the plasma chamber 210. An upper insulator 222 may be disposed between the source tube and an upper plate of the plasma chamber 210. A lower insulator 232 may be disposed between the protrusion of the substrate holder 230 and a bottom plate of the plasma chamber 210. Thus, the interior of the plasma chamber 210 may be insulated from the exterior. A chamber gate (not shown) may be positioned at a sidewall of the plasma chamber 210 and the substrate 100 may be loaded into or unloaded front the plasma chamber 210 through the chamber gate. The plasma chamber 210 may be electrically grounded by a ground member in the plasma etching process.

An exhaust port 215 may be positioned at a bottom portion of thaw plasma chamber 210. For example, the exhaust port 215 may be connected to a vacuum pump (not shown) and byproducts of the etching process and residuals of the source gases may be exhausted from the plasma chamber 210 through the exhaust port 215.

The source supplier 220 may be connected to a source reservoir 240 and the source gases for the plasma etching process may be supplied into the plasma chamber 210 by the source supplier 220 to generate the etching plasma PLA.

For example, the source supplier 220 may include the source tube 224, which may transfer the source gases to the plasma chamber 210 from the source reservoir 240, a shower head 226 connected to the source tube 224 to discharge the source gases over the substrate 100, and a top electrode 228 positioned in the shower head 226 to apply RF source power to the source gases in the plasma chamber 210.

The shower head 226 may include at least one conductive material, which may have a 3-dimensional plate shape having a gas space therein. The source gases flowing in the source tube 224 may be transferred into a gas space S of the shower head 226 and then may be discharged into the interior of the plasma chamber 210 through a plurality of injection holes 225.

The top electrode 228 in the shower head 226 may be connected to an RF power source via the source tube 224. The source gases may be supplied into the gas space of the shower head 226 through the source tube 224 and may be supplied into the plasma chamber 210 through the injection holes 225. The source gases may be changed into etching plasma PLA by the RF power applied to the top electrode 228 and/or the bottom electrode 236

The substrate holder 230 may be positioned at the bottom of the plasma chamber 210 opposite the source supplier 220. For example, the substrate holder 230 may include an electrostatic chuck (ESC) or a vacuum chuck.

In some example embodiments, the substrate holder 230 may include an ESC having a suceptor 234 having a plurality of electrodes. The substrate 100 may be secured to the substrate holder 230 by an electrostatic force. The ESC may include a buried electrode generating the electrostatic force and the bottom electrode 236 for applying the RF power or the ground voltage.

As such, the RF power may be applied to the top electrode 228 and/or the bottom electrode 236, and the source gases may be changed into the etching plasma FLA over the substrate 100. Thus the plasma sheath may be provided between the substrate 100 and the shower head 226 in the plasma chamber 210.

The first RF power supplier 310 may generate a first RF driving pulse signal RFDP1 including first RF pulses by pulsing a first RF signal SRF1 having a first frequency. The first RF driving pulse signal RFDP1 may be applied to the top electrode 228 and/or the bottom electrode 236.

The second RF power supplier 320 may generate a second RF driving pulse signal RFDP2 including second RF pulses by pulsing a second RF signal SRF2 having a second frequency lower than the first frequency. The second RF driving pulse signal RFDP2 may be applied to the top electrode 228 and/or the bottom electrode 236.

FIG. 2 illustrates, as a non-limiting example embodiment, that the first RF driving pulse signal RFDP1 and the second RF driving pulse signal RFDP2 are applied to the bottom electrode 236. As will be described below with reference to FIGS. 9A through 9D, in alternative configurations the first RF driving pulse signal RFDP1 and the second RF driving pulse signal RFDP2 may be applied to the top electrode 228 and/or the bottom electrode 236 to apply the RF power to the plasma chamber 210.

The first RF power supplier 310 may include a first signal generator 311, a first pulse switch 312 and a first impedance matching circuit IMC 313. Likewise, the second RF power supplier 320 may include a second signal generator 321, a second pulse switch 322 and a second impedance matching circuit 323.

The first signal generator 311 may include an oscillator to generate the first RF signal SRF1 having the first frequency. The first pulse switch 312 may pulse the first RF signal SRF1 in response to a first pulse timing signal SPT1 to generate the first RF driving pulse signal RFDP1 having the first RF pulses. The first impedance matching circuit 313 may match the impedance of the signal generator 311 providing the first RF driving pulse signal RFDP1 with the impedance of the electrode connected to the first RF power supplier 310 to maximize the transferred power.

The second signal generator 321 may include an oscillator to generate the second RF signal SRF2 having the second frequency lower than the first frequency. The second pulse switch 322 may switch the second RF signal SRF2 in response to a second pulse timing signal SPT2 to generate the second RF driving pulse signal RFDP2 having the second RF pulses. The second impedance matching circuit 323 may match the impedance of the signal generator 321 providing the second RF driving pulse signal RFDP2 with the impedance of the electrode connected to the second RF power supplier 320 to maximize the transferred power.

The first frequency is relatively high for controlling plasma density and the second frequency is relatively low for controlling ion energy. For example, the first frequency may be higher than 40 MHz and the second frequency may be lower than 600 kHz.

The controller 500 may generate a harmonic control signal SHC including harmonic control pulses based on timings of the first RF pulses and the second RF pulses. In addition, the controller 500 may generate the first pulse timing signal SPT1 to control the timings of the first RF pulses in the first RF driving pulse signal RFDP1 and the second pulse timing signal SPT2 to control the timings of the second RF pulses in the second RF driving pulse signal RFDP2. Example embodiments of generating the first RF driving pulse signal RFDP1, the second RF driving pulse signal RFDP2 and the harmonic control signal SHC will be described below.

The harmonic control circuit 400 may be connected between at least one of the first RF power supplier 310 and the second RF power supplier 320 and the top electrode 228 and/or the bottom electrode 236. For convenience of illustration, FIG. 2 illustrates an example configuration in which the harmonic control circuit 400 is connected between the bottom electrode 236 and the first and second power suppliers 310 and 320.

The harmonic control circuit 400 may be driven based on the harmonic control signal SHC to reduce the harmonic component generated by the first RF driving pulse signal RFDP1 and the second RF driving pulse signal RFDP2. Example embodiments of the harmonic control circuit 400 will be described below with reference to FIG. 6.

Figure 3:
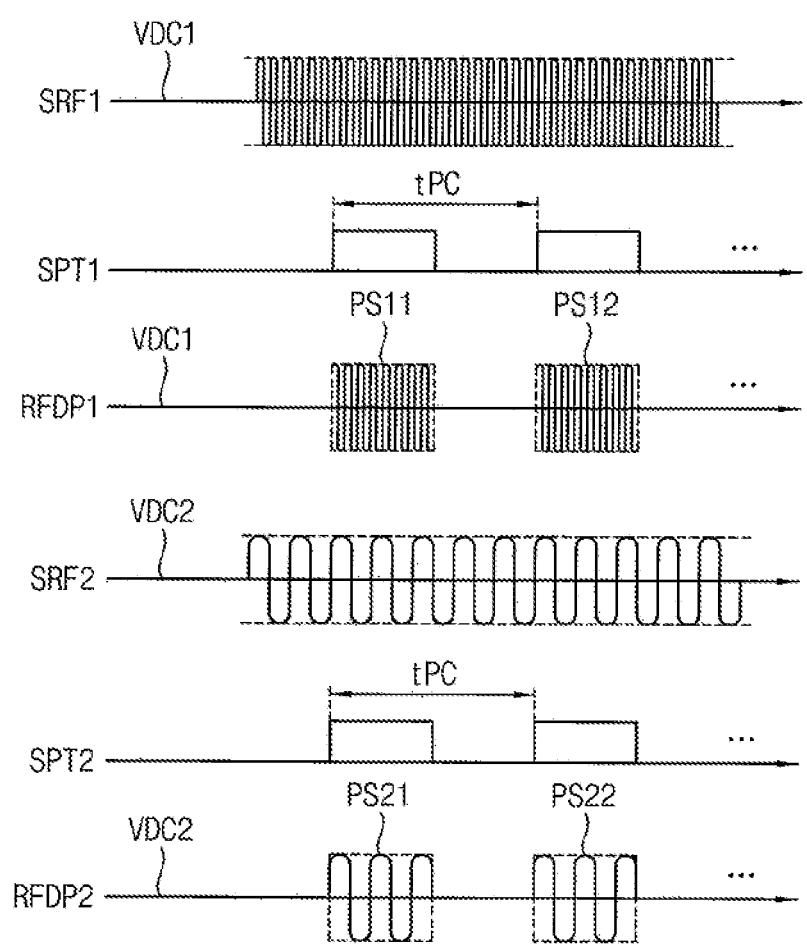
FIG. 3 is a diagram illustrating an example embodiment of generating RF driving pulse signals.

FIG. 3 is a diagram illustrating an example embodiment of generating RF driving pulse signals. Referring to FIGS. 2 and 3, the first signal generator 311 may generate the first RF signal SRF1 that oscillates at the first frequency with a first DC voltage VDC1 as a central level, and the second signal generator 321 may generate the second RF signal SRF2 that oscillates at the second frequency with a second DC voltage VDC2 as a central level. As described above, the first frequency may be relatively high for controlling plasma density and the second frequency may be relatively low for controlling ion energy.

The first pulse switch 312 may perform on/off switching to pulse the first RF signal SRF1 in response to the first pulse timing signal SPT1 to generate the first RF driving pulse signal RFDP1 including the first RF pulses PS11 and PS12. In other words, the first pulse switch 312 may generate the first pulses PS11 and PS12 of the first RF driving pulse signal RFDP1 by being turned on to pass the first RF signal SRF1 while the first pulse timing signal SPT1 is in a first logic level (e.g., a logic high level) and the first switch 312 is turned off to block the first RF signal SRF1 while the first pulse timing signal SPT1 is in a second logic level (e.g., a logic low level).

The second pulse switch 322 may perform on/off switching to pulse the second RF signal SRF2 in response to the second pulse timing signal SPT2 to generate the second RF driving pulse signal RFDP2 including the second RF pulses PS21 and PS22. In other words, the second pulse switch 322 may generate the second pulses PS21 and PS22 of the second RF driving pulse signal RFDP2 by being turned on to pass the second RF signal SRF2 while the second pulse timing signal SPT2 is in a first logic level (e.g., a logic high level) and the second switch 322 is turned off to block the second RF signal SRF2 while the second pulse timing signal SPT2 is in a second logic level (e.g., a logic low level).

Hereinafter, the first RF pulses PS11 and PS12 and the second RF pulses PS21 and PS22 illustrated in FIG. 3 are represented only using the envelopes for convenience of illustration. It is readily understood that the envelopes are portions of the RF signals oscillating with the DC voltages VDC1 and VDC2 as the central levels.

Figure 4:
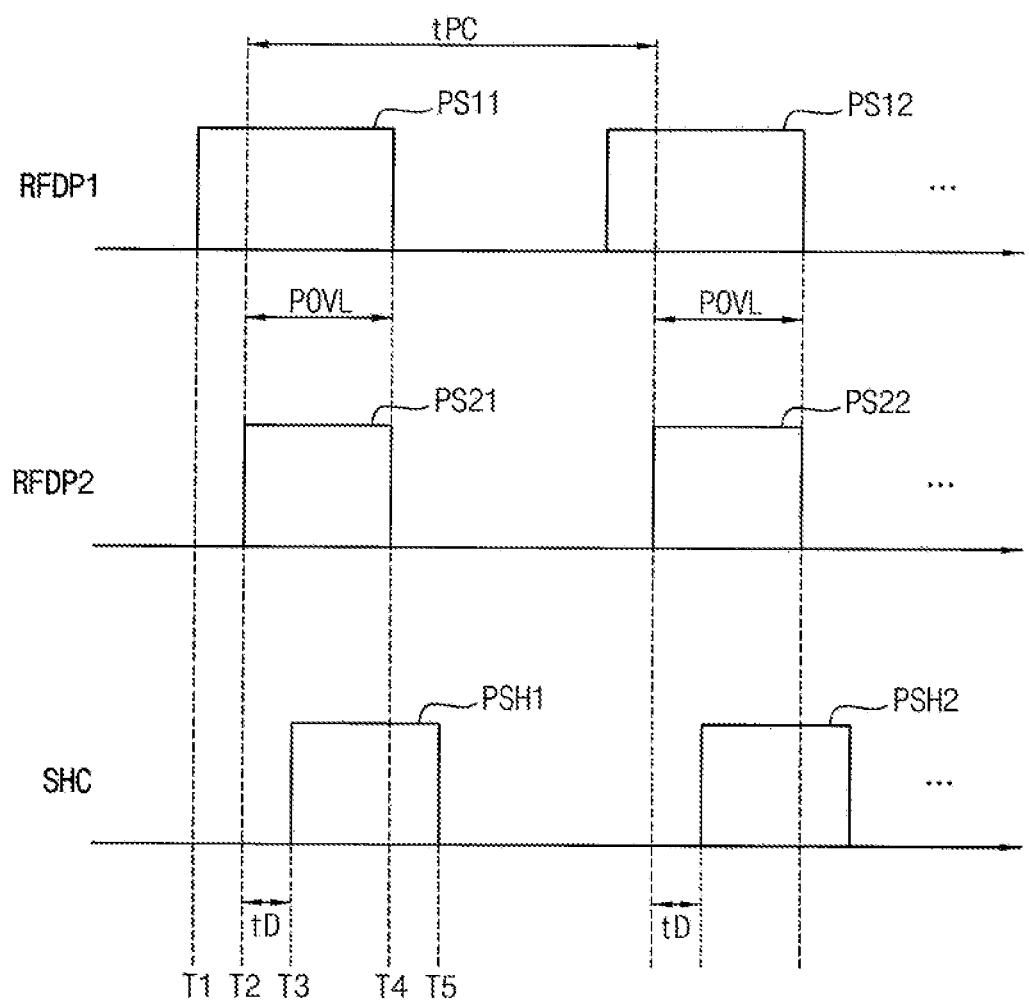
FIG. 4 is a timing diagram illustrating a method of controlling uniformity of plasma according to example embodiments.

FIG. 4 is a timing diagram illustrating a method of controlling uniformity of plasma according to example embodiments. FIG. 4 illustrates example timings of the first RF driving pulse signal RFDP1 and the second RF driving pulse signal RFDP2 and timings of the harmonic control signal SHC based on the timings of the first RF driving pulse signal RFDP1 and the second RF driving pulse signal RFDP2.

Referring to FIGS. 2 and 4, the controller 500 may control the timings of the first RF driving pulse signal RFDP1 and the second RF driving pulse signal RFDP2 such that the first RF pulse PS11 is activated at a time point T1 and deactivated at a time point T4, and the second RF pulse PS21 is activated at a time point T2 and deactivated at the time point T4.

In addition, the controller 500 may control the timings of the harmonic control signal SHC such that the harmonic control pulse PSH1 is activated at a time point T3 after a delay time tD from the time point T2 corresponding to a start time point of an overlapping period POVL of the first RF pulse PS11 and the second RF pulse PS21. FIG. 4 illustrates that the harmonic control pulse PSH1 is deactivated at a time point T5 after the end time point of the overlapping period POVL, but example embodiments are not limited thereto. For example, the harmonic control pulse PSH1 may be deactivated at the time point T4 when the first RF pulse PS11 and the second RF pulse PS21 are deactivated.

The first RF pulses PS11 and PS12, the second RF pulses PS21 and PS22 and the harmonic control pulses PSH1 and PSH2 may have an equal pulse frequency, that is, an equal pulse cyclic period tPC. Accordingly, the timing relation between the first RF pulse PS12, the second RF pulse PS22 and the harmonic control pulse PSH2 may be the same as the timing relation between the first RF pulse PS11, the second RF pulse PS21 and the harmonic control pulse PSH1. In some example embodiments, the pulse frequency 1/tPC may be higher than 500 Hz and lower than 5 kHz.

The delay time tD may be set to be longer than a plasma saturation time for which the plasma caused by the first RF pulses PS11 and PS12 and the second RF pulses PS21 and PS22 in the plasma chamber 210 is saturated. In some example embodiments, the delay time tD may be longer than 5 μs.

As such, the harmonic control signal SHC including the harmonic control pulses PSH1 and PSH2 may be generated based on the timings of the first RF pulses PS11 and PS12 and the second RF pulses PS21 and PS22, for example, by activating the harmonic control pulses PSH1 and PSH2 after the delay time tD from the start time points T2 of the overlapping periods POVL of the first RF pulses PS11 and PS12 and the second RF pulses PS21 and PS22.

Figure 5:
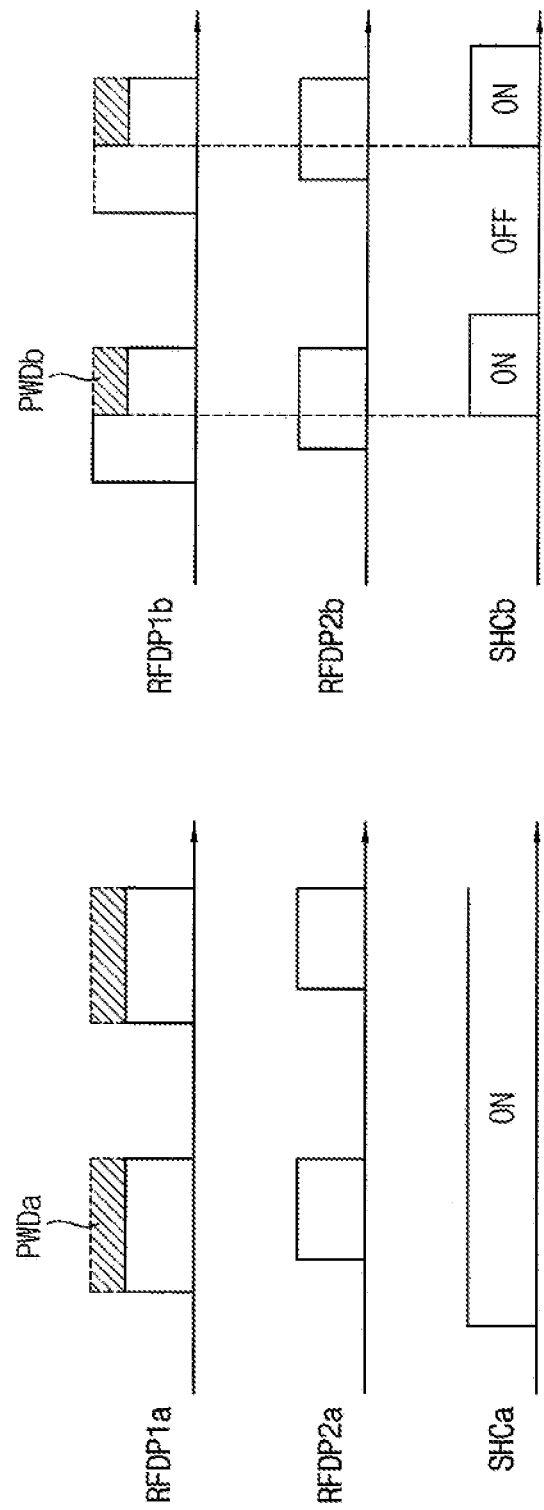
FIG. 5 is a diagram for describing power loss by methods of controlling uniformity of plasma.

FIG. 5 is a diagram for describing power loss by methods of controlling uniformity of plasma. The left portion of FIG. 5 corresponds to a first case in which a harmonic control signal SHCa is always activated throughout the time intervals that RF power is applied at each of the first and second frequencies. (This case will be referred to hereafter as the "continuous harmonic control".) The right portion of FIG. 5 corresponds to a second case in which a harmonic control signal SHCb is activated periodically in pulses, as described with reference to FIG. 4. The time intervals of the harmonic control signal SHCb pulses may not encompass an entirety of the time intervals of each of the first and second RF driving pulses RFDP1b and RFDP2b.

The first RF driving pulse signal RFDP1a and the second RF driving pulse signal RFDP2a of the first case are the same as the first RF driving pulse signal RFDP1b and the second RF driving pulse signal RFDP2b of the second case, and thus the supplied RF power is the same with respect to the first and second cases.

The harmonic control circuit maintains an ON state or an enabled state to activate the harmonic control signal SHCa all the time in the first case. On the other hand, the harmonic control circuit 400 may repeat an ON state and an OFF state because the harmonic control signal SHCb is activated and deactivated in the second case.

As a result, the RF power loss PWDb of the second case of the harmonic control based on the timings of the RF power supply, that is, the timings of the first RF pulses and second RF pulses of the first RF driving pulse signal. RFDP1b and the second RF driving pulse signal RFDP2b may be less than the RF power loss PWDa of the first case of the continuous harmonic control.

The harmonic component may be varied depending on the plasma characteristics because the harmonic component is generated by nonlinearity including the plasma sheath. The characteristics of the plasma sheath depend on the RF pulses of the relatively low frequency and the harmonic component may be at a stable level after the plasma saturation time. If the harmonic control is performed uniformly independently of the timing of the RF power supplies, unnecessary power loss may result and thus the etching rate may be reduced.

According to example embodiments, the harmonic control signal is pulsed, that is, turned on and off periodically, according to the RF pulses, and may be periodically deactivated during a portion (e.g., a minority portion) of the first RF pulses (PS11, PS12, . . . ) and/or the second RF pulses (PS21, PS22, . . . ) and may be activated during a remaining portion of the first and/or second RF pulses. Through the delay time longer than the plasma saturation time with respect to the lower-frequency RF pulses, the harmonic control may be implemented with the loss of the etching rate minimized.

As such, the method of controlling uniformity of plasma and the plasma processing system according to example embodiments may improve uniformity of plasma while attaining a targeted etching rate by controlling the harmonic wave based on timings of the RF driving pulses.

Figure 6:
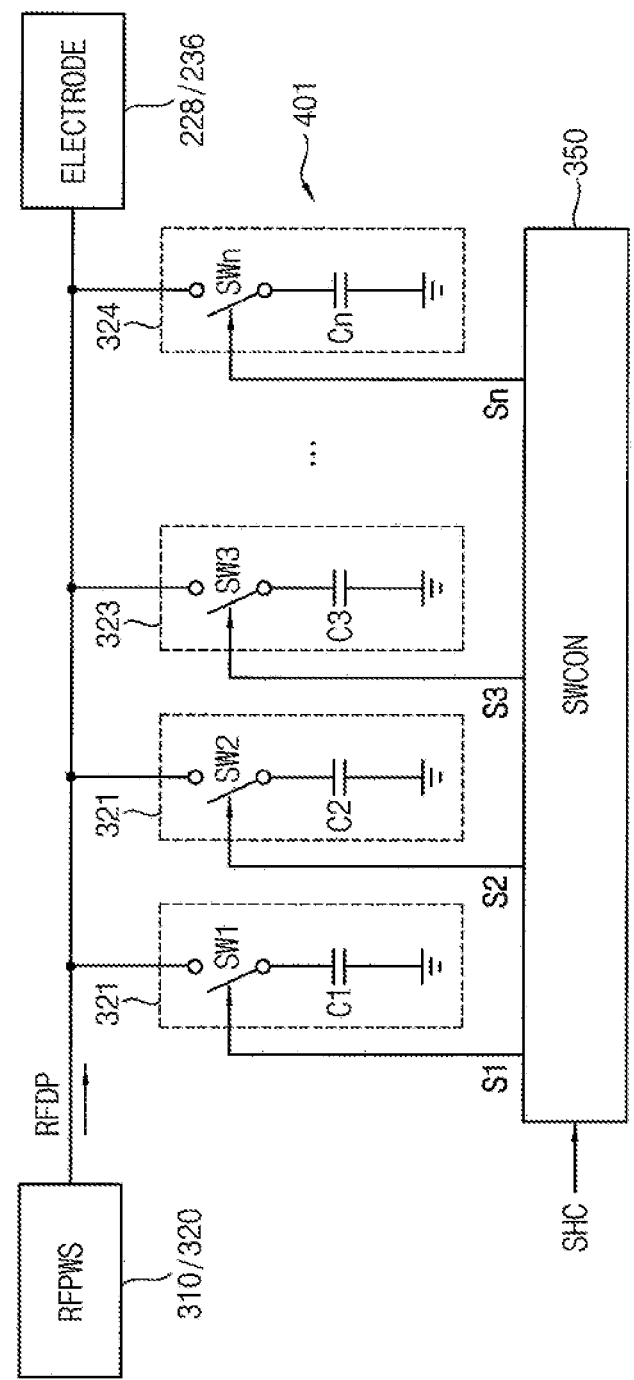
FIG. 6 is a diagram illustrating an example embodiment of a harmonic control circuit included in a plasma processing system according to example embodiments.

FIG. 6 is a diagram illustrating an example embodiment of a harmonic control circuit included in a plasma processing system according to example embodiments.

Referring to FIG. 6, a harmonic control circuit 401 may include a plurality of impedance circuits 321, 322, 323 . . . 324 and a switch controller SWCON 350.

The plurality of impedance circuits 321~324 may be electrically connected, in response to a plurality of switch signals S1~Sn, to a path through which an RF driving pulse signal RFDP is transferred between an RF power supplier RFPWS and an electrode. The RF power supplier RFPWS in FIG. 6 corresponds to one of the first RF power supplier 310 and the second RF power supplier 320 as described above and the electrode in FIG. 6 corresponds to one of the top electrode 228 and the bottom electrode 236 as described above.

The switch controller 350 may generate the plurality of switch signals S1~Sn based on the harmonic control signal SHC and a total impedance that is set to reduce the harmonic component.

In some example embodiments, the impedance circuits 321~324 may include switches SW1~SWn and loads C1~Cn, respectively. FIG. 6 illustrates, as a non-limiting example, the capacitive loads, that is, the capacitors C1~Cn, but the loads may be capacitive loads such as capacitors, inductive loads such as inductors or various combinations thereof.

The total impedance to reduce the harmonic component may be set by a combination of the switch signals S1~Sn that are activated in response to the harmonic control signal SHC. For example, if the total impedance is set to C1+C2, the first switch signal S1 and the second switch signal S2 may be activated in response to the harmonic control signal SHC and the remaining switch signals S3~Sn may be deactivated regardless of the harmonic control signal SHC. In this case, the total impedance of C1+C2 may be added to the RF power transfer path periodically in response to the harmonic control signal SHC to provide a leakage path of the harmonic component.

In some example embodiments, the impedances of the loads C1~Cn may be set to be equal and the total impedance may be represented by multiplication of a unit impedance of each impedance circuit and the number of the impedance circuits that are enabled in response to the harmonic control signal SHC. In some example embodiments, the impedances of at least two of the loads C1~Cn may be set to be different.

Figure 7:
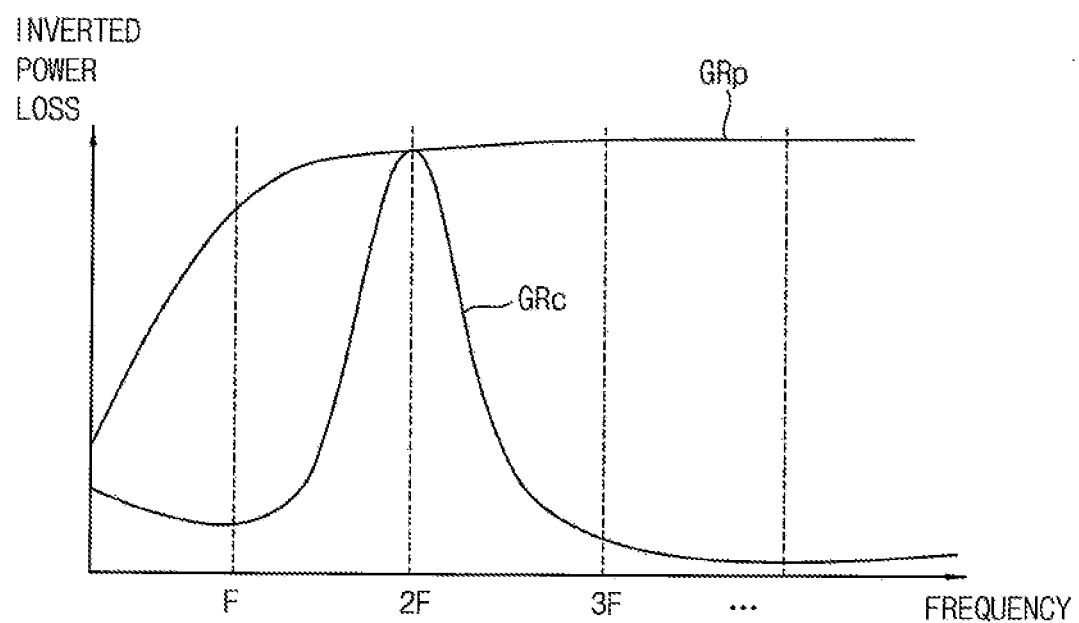
FIG. 7 is a diagram illustrating characteristics of a harmonic control circuit included in a plasma processing system according to example embodiments.

FIG. 7 is a diagram illustrating characteristics of a harmonic control circuit included in a plasma processing system according to example embodiments. In FIG. 7, the horizontal axis represents a frequency and the vertical axis represents inverted power loss of a harmonic control circuit. A curve GRc indicates characteristics of a conventional circuit and a graph GRp indicates characteristics of a harmonic control circuit according to example embodiments. For example, when a second harmonic component 2F of a fundamental frequency F is a target frequency, the conventional circuit uses a resonance filter, e.g., with characteristics of the curve GRc. In contrast, the harmonic control circuit according to example embodiments may use various filters independent of the target frequency. The harmonic control circuit according to example embodiments may include a resonance filter, a low pass filter, a high pass filter or a combination thereof.

Figure 8A:
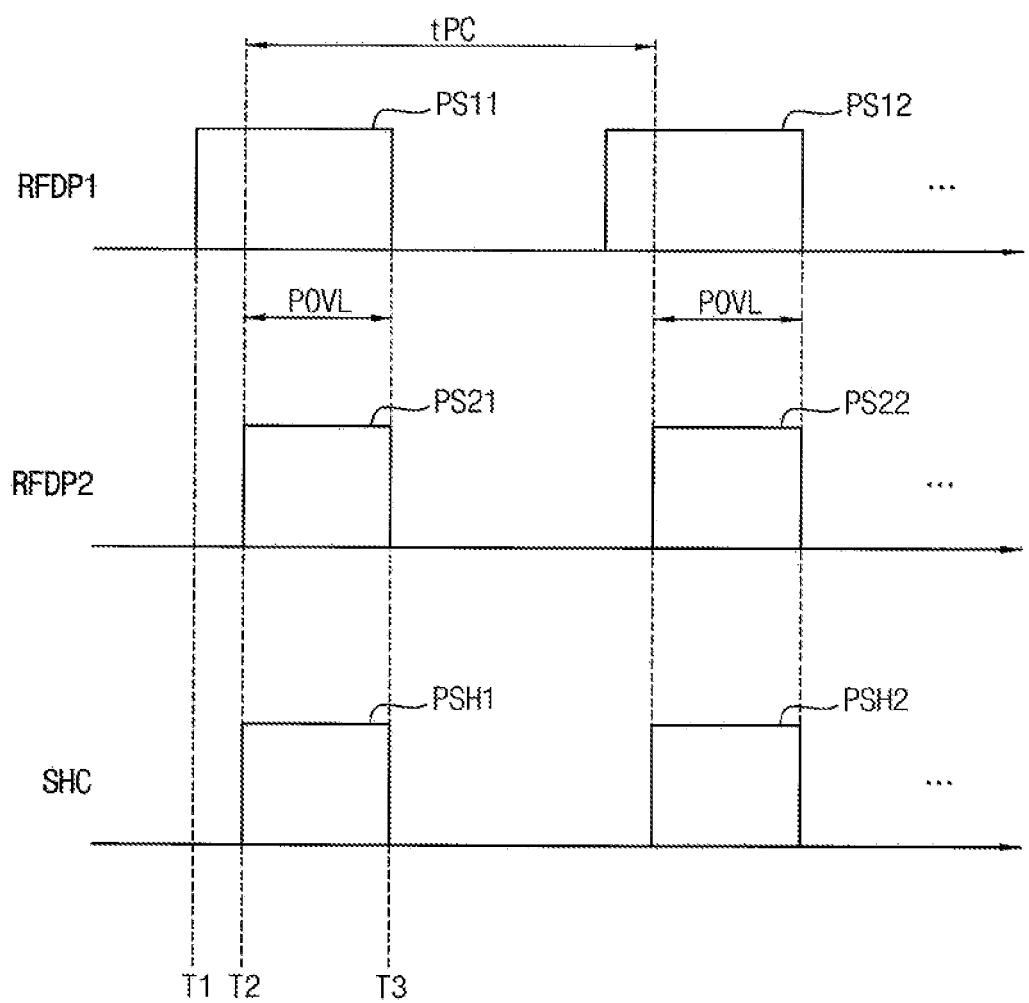
FIGS. 8A and 8B are timing diagrams illustrating methods of controlling uniformity of plasma according to respective embodiments.
Figure 8B:
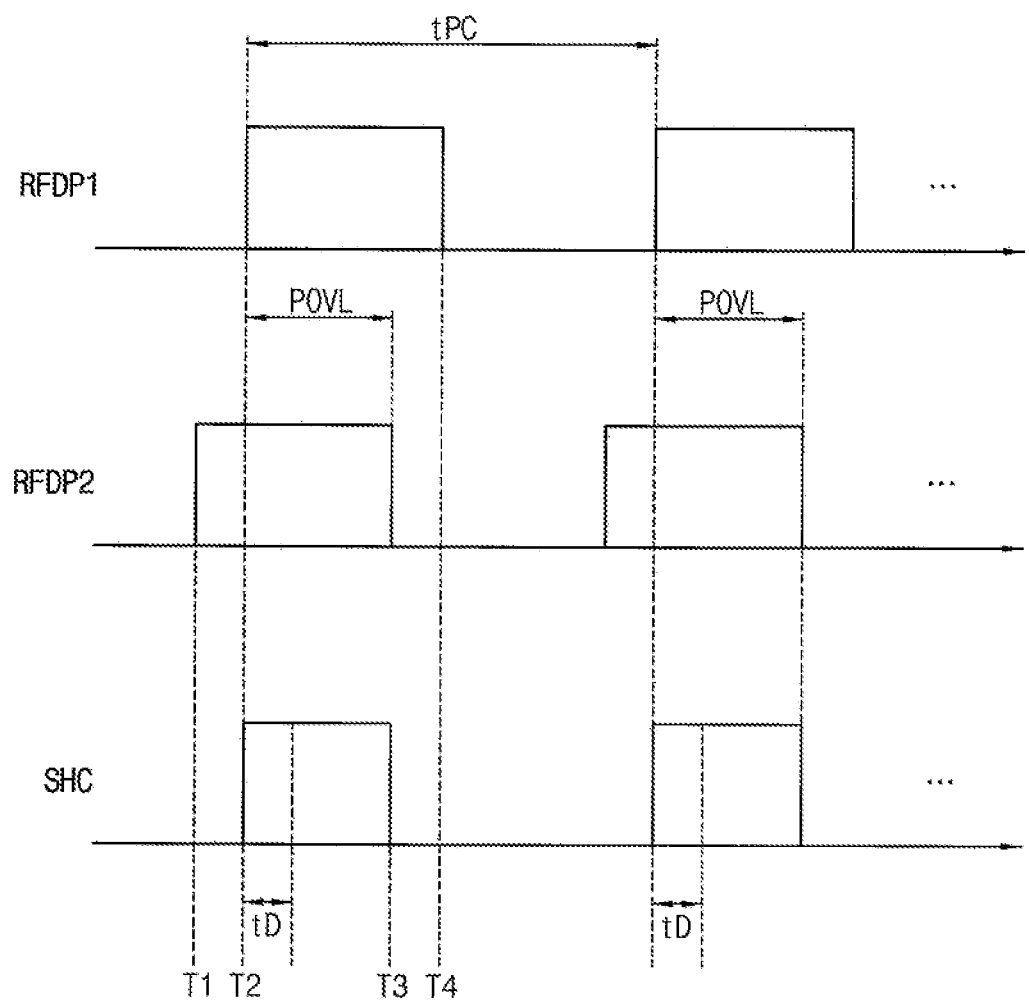

FIGS. 8A and 8B are timing diagrams illustrating methods of controlling uniformity of plasma according to respective embodiments. FIGS. 8A and 8B illustrate example timings of the first RF driving pulse signal RFDP1 and the second RF driving pulse signal RFDP2 and timings of the harmonic control signal SHC based on the timings of the first RF driving pulse signal RFDP1 and the second RF driving pulse signal RFDP2. In each of FIGS. 7A and 8B, the harmonic control signal is periodically deactivated during a minority portion of at least one of the first and second RF driving pulses RFDP1 and RFDP2. During the periodic deactivation periods, the harmonic control circuit 400 is off and thereby does not generate loss at the fundamental frequency or frequencies (that is, the first frequency and/or the second frequency).

Referring to FIGS. 2 and 8A, the controller 500 may control the timings of the first RF driving pulse signal RFDP1 and the second RF driving pulse signal RFDP2 such that the first RF pulse PS11 is activated at a time point T1 and deactivated at a time point T3, and the second RF pulse PS21 is activated at a time point T2 and deactivated at the time point T3. In the example of FIG. 8A, the harmonic control signal SHC is periodically deactivated during minority portions of the first RF driving pulse signal RFDP1 pulses; is periodically activated during the remaining portions of the first RF driving pulse signal RFDP1 pulses; and is periodically activated during the entire durations of the second RF driving pulse signal RFDP2 pulses.

For instance, the controller 500 may control the timings of the harmonic control signal SHC such that the harmonic control pulse PSH1 is activated at the time point T2 corresponding to a start time point of an overlapping period POVL of the first RF pulse PS11 and the second RF pulse PS21. FIG. 8A illustrates that the harmonic control pulse PSH1 is deactivated at the time point T3, but in other embodiments such deactivation may occur earlier or later. For example, the harmonic control pulse PSH1 may be deactivated by a delay time after the time point T3 when the first RF pulse P511 and the second RF pulse PS21 are deactivated.

The first RF pulses PS11 and PS12, the second RF pulses PS21 and PS22 and the harmonic control pulses PSH1 and PSH2 may have an equal pulse repetition frequency (PRF), that is, an equal pulse cyclic period tPC. Accordingly, the timing relation between the first RF pulse PS12, the second RF pulse PS22 and the harmonic control pulse PSH2 may be the same as the timing relation between the first RF pulse PS11, the second RF pulse PS21 and the harmonic control pulse PSH1. In some example embodiments, the pulse frequency 1/tPC may be higher than 500 Hz and lower than 5 kHz.

As such, the harmonic control signal SHC including the harmonic control pulses PSH1 and PSH2 may be generated based on the timings of the first RF pulses PS11 and PS12 and the second RF pulses PS21 and PS22, for example, by activating the harmonic control pulses PSH1 and PSH2 at the start time points T2 of the overlapping periods POVL of the first RF pulses PS11 and PS12 and the second RF pulses PS21 and PS22.

Referring to FIGS. 2 and 8B, the controller 500 may control the timings of the first RF driving pulse signal RFDP1 and the second RF driving pulse signal RFDP2 such that the first RF pulse PS11 is activated at a time point T2 and deactivated at a time point T4, and the second RF pulse PS21 is activated at a time point T1 and deactivated at a time point T3. In the example of FIG. 8B, the harmonic control signal SHC is periodically deactivated during minority portions of the pulses of each of the first and second RF driving pulse signals RFDP1 and RFDP2; and is periodically activated during the remaining portions of the pulses of each of the first and second RF driving pulse signals RFDP1 and RFDP2.

In addition, the controller 500 may control the timings of the harmonic control signal SHC such that the harmonic control pulse PSH1 is activated at the time point T2 corresponding to a start time point of an overlapping period POVL of the first RF pulse PS11 and the second RF pulse PS21. According to example embodiments, as described with reference to FIG. 4, the controller 500 may activate the harmonic control pulse PSH1 after the delay time tD from the start time point T2 of the overlapping period POVL of the first RF pulse PS11 and the second RF pulse PS21.

As illustrated in FIG. 8B, the controller 500 may control the timings of the harmonic control signal SHC such that the harmonic control pulse PSH1 is deactivated at the time point T3 corresponding to the end time point of the overlapping period POVL. As a result, unnecessary RF power loss may be reduced by setting the activation period of the harmonic control pulse PSH1 based on the overlapping period POVL.

The first RF pulses PS11 and PS12, the second RF pulses PS21 and PS22 and the harmonic control pulses PSH1 and PSH2 may have an equal pulse repetition frequency, that is, an equal pulse cyclic period tPC. Accordingly, the timing relation between the first RF pulse PS12, the second RF pulse PS22 and the harmonic control pulse PSH2 may be the same as the timing relation between the first RF pulse PS11, the second RF pulse PS21 and the harmonic control pulse PSH1.

As such, the harmonic control signal SHC including the harmonic control pulses PSH1 and PSH2 may be generated based on the timings of the first RF pulses PS11 and PS12 and the second RF pulses PS21 and PS22, for example, by activating the harmonic control pulses PSH1 and PSH2 at the start time points T2 of the overlapping periods POVL and deactivating the harmonic control pulses PSH1 and PSH2 at the end time points T3 of the overlapping periods POVL.

FIGS. 9A through 9D are diagrams illustrating plasma processing systems according to respective embodiments.

Referring to FIGS. 9A through 9D, plasma processing systems 1001, 1002, 1003 and 1004 each include a plasma chamber 10 including a top electrode 12 and a bottom electrode 14 where a wafer or a semiconductor substrate 100 is mounted. These configurations illustrate various example embodiments of connections of a first RF power supplier RFPWS1, a second RF power supplier RFPWS2 and a harmonic control circuit HCC with the electrodes 12 and 14. As described above, the first RF power supplier RFPWS1 may generate the first RF driving pulse signal RFDP1 including the first RF pulses in response to the first pulse timing signal SPT1, the second RF power supplier RFPWS2 may generate the second RF driving pulse signal RFDP2 including the second RF pulses in response to the second pulse timing signal SPT2, and the harmonic control circuit HCC may be enabled in response to the harmonic control signal SHC.

Figure 9A:
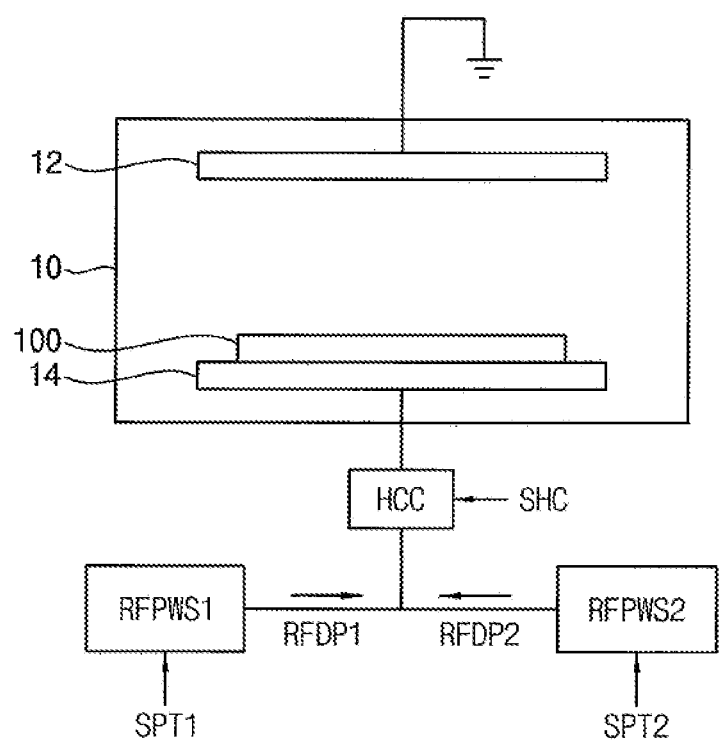
FIGS. 9A, 9B, 9C and 9D are diagrams illustrating plasma processing systems according to respective embodiments.

Referring to FIG. 9A, both of the first driving pulse signal RFDP1 and the second RF driving pulse signal RFDP2 may be applied to the bottom electrode 14 and the harmonic control circuit HCC may be connected between the bottom electrode 14 and the RF power suppliers RFPWS1 and RFPWS2. The top electrode 12 may be connected to a ground point.

Figure 9B:
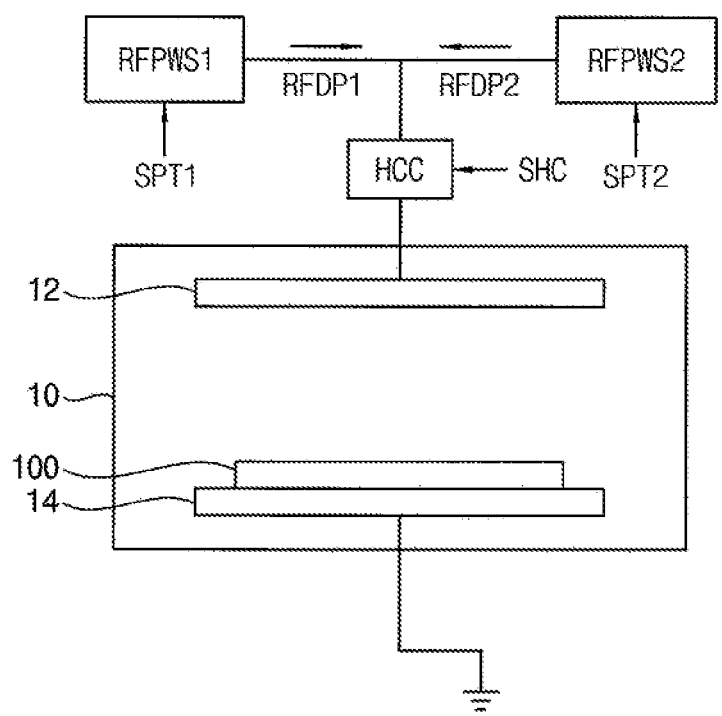

Referring to FIG. 9B, both of the first RF driving pulse signal RFDP1 and the second RF driving pulse signal RFDP2 may be applied to the top electrode 12 and the harmonic control circuit HCC may be connected between the top electrode 12 and the RF power suppliers RFPWS1 and RFPWS2. The bottom electrode 14 may be connected to a ground point.

Figure 9C:
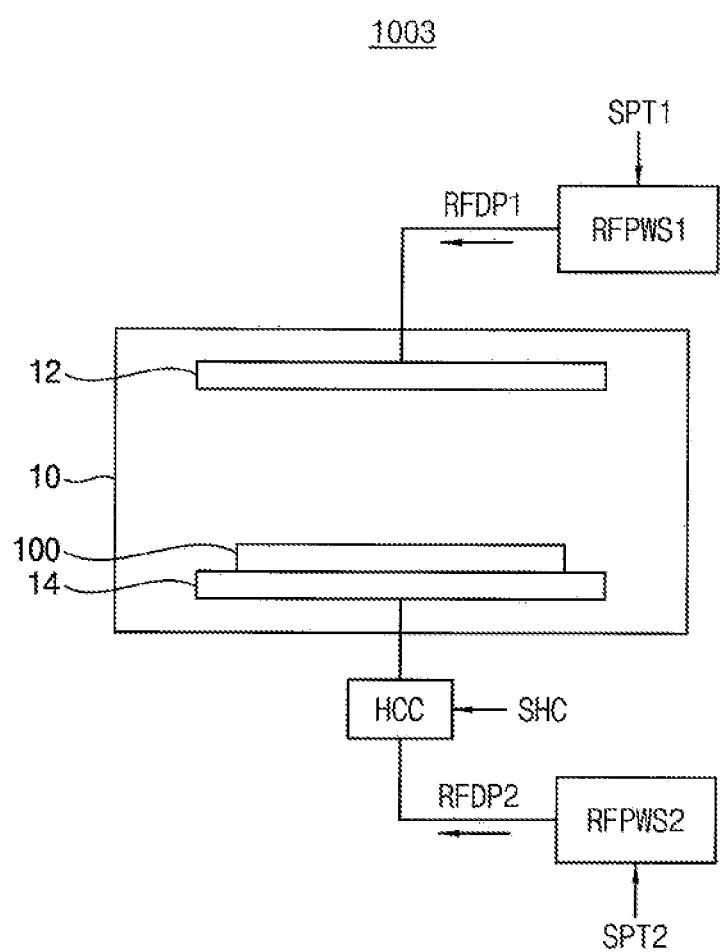

Referring to FIG. 9C, the first RF driving pulse signal RFDP1 may be applied to the top electrode 12, the second RF driving pulse signal RFDP2 may be applied to the bottom electrode 14 and the harmonic control circuit HCC may be connected between the bottom electrode 14 and the second RF power supplier RFPWS2.

Figure 9D:
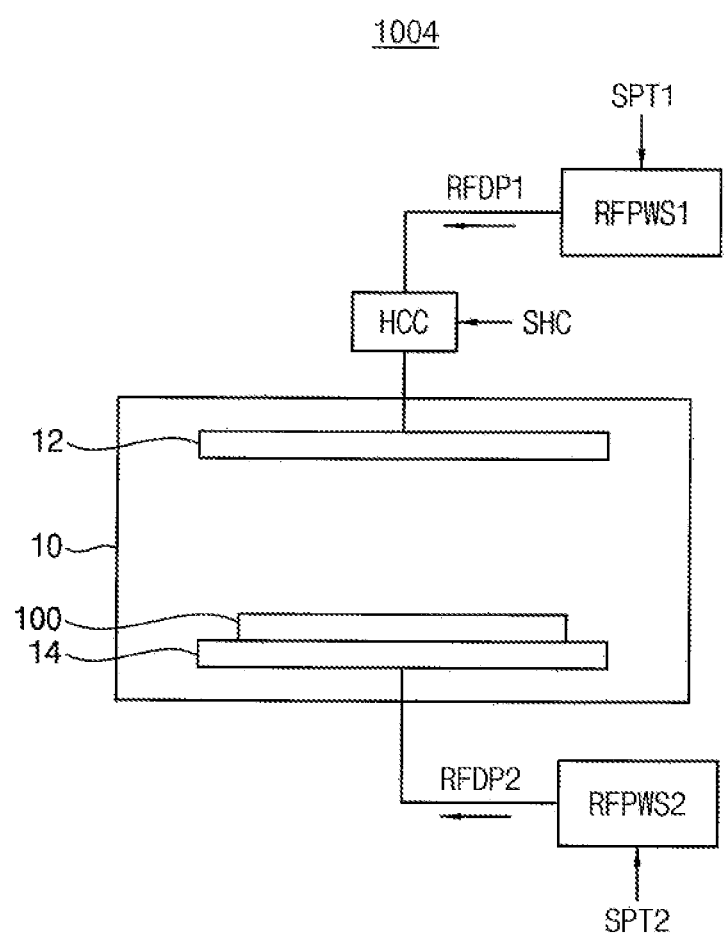

Referring to FIG. 9D, the first RF driving pulse signal RFDP1 may be applied to the top electrode 12, the second RF driving pulse signal RFDP2 may be applied to the bottom electrode 14 and the harmonic control circuit HCC may be connected between the top electrode 12 and the first RF power supplier RFPWS1.

In other embodiments (not shown), the first RF driving pulse signal RFDP1 may be applied to the bottom electrode 14 and the second RF driving pulse signal RFDP2 may be applied to the top electrode 12.

Figure 10:
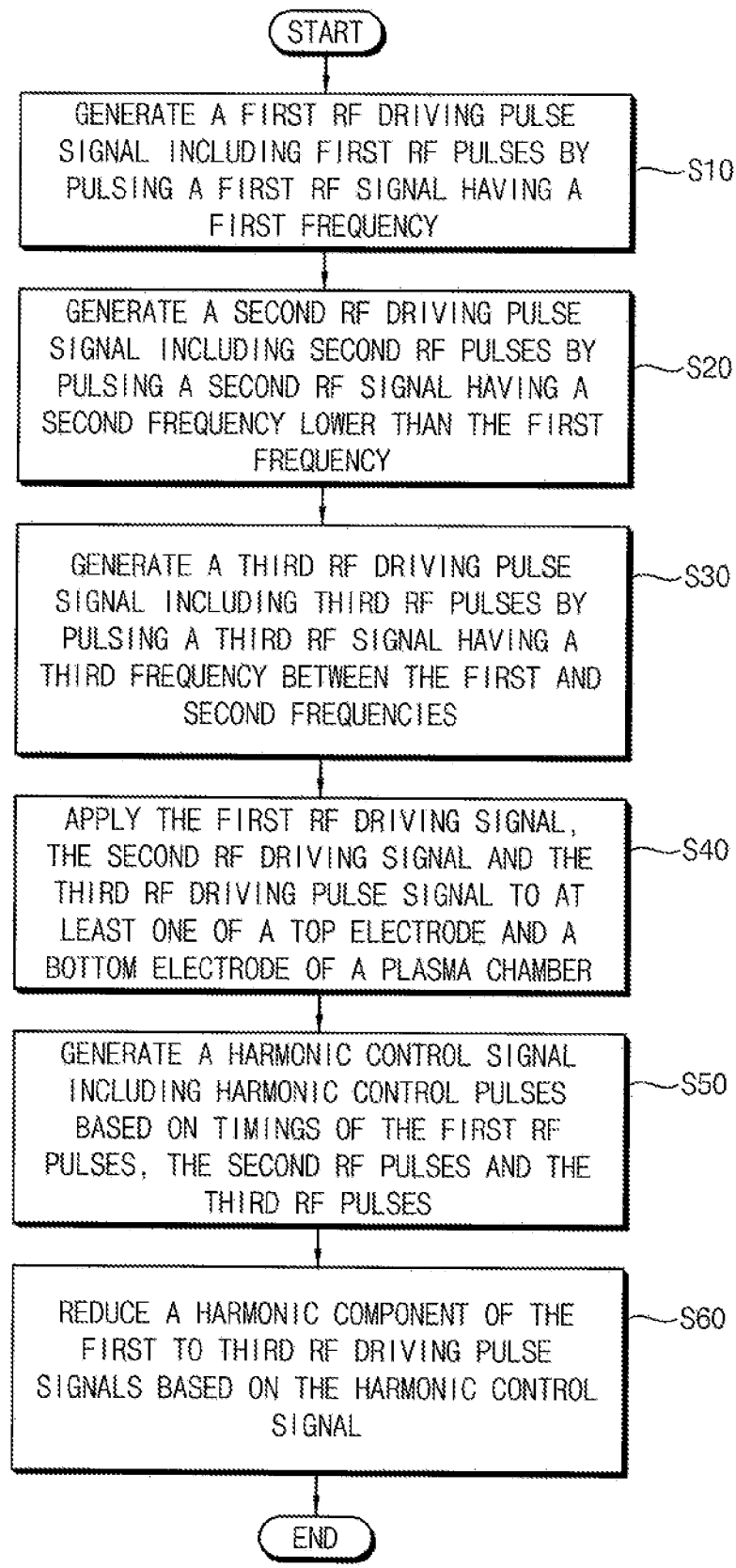
FIG. 10 is a flow chart illustrating a method of controlling uniformity of plasma according to example embodiments.

FIG. 10 is a flow chart illustrating a method of controlling uniformity of plasma according to example embodiments. With this method, a first RF driving pulse signal including first RF pulses is generated by pulsing a first RF signal having a first frequency (S10), a second RF driving pulse signal including second RF pulses is generated by pulsing a second RF signal having a second frequency lower than the first frequency (S20), and a third RF driving pulse signal including third RF pulses is generated by pulsing a third RF signal having a third frequency lower than the first frequency and higher than the second frequency (S30).

The first frequency is relatively high for controlling plasma density, and the second frequency and the third frequency are relatively low for controlling ion energy. For example, the first frequency may be higher than 40 MHz, the second frequency may be lower than 600 kHz, and the third frequency may be lower than 2 MHz.

The first RF driving signal, the second RF driving signal and the third RF driving signal are applied to at least one of a top electrode and a bottom electrode of a plasma chamber (S40). Various schemes for applying the first to third RF driving pulse signals may be implemented as will be described below with reference to FIGS. 16A and 16B.

A harmonic control signal including harmonic control pulses is generated based on timings of the first, second and third RF pulses, (S50). As described above, to prevent deterioration of the etching rate correlated with the loss of the RF power transferred through the first through third RF driving pulse signals, timings of the harmonic control pulses may be controlled based on overlapping periods of the first to third RF pulses.

A harmonic component of the first to third RF driving pulse signals is reduced based on the harmonic control signal (S60). The reduction of the harmonic component or the harmonic wave may be implemented using a harmonic control circuit to provide a leakage path of the harmonic component as described above.

Figure 11:
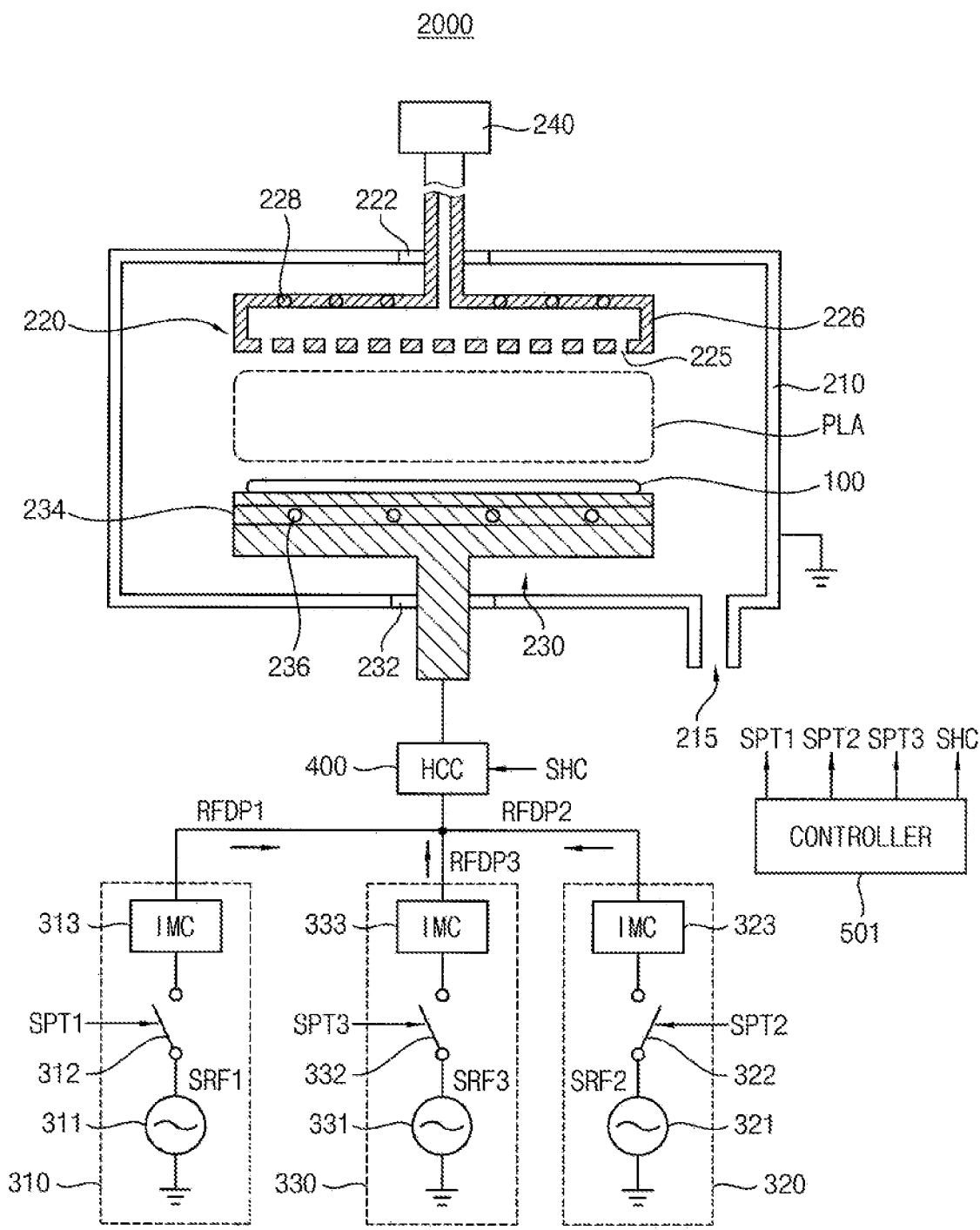
FIG. 11 is a block diagram illustrating a plasma processing system according to example embodiments.

As such, the method of controlling uniformity of plasma and the plasma processing system according to example embodiments may improve uniformity of plasma while maintaining a desired etching rate by controlling harmonic energy based on timings of the RF driving pulses, FIG. 11 is a block diagram illustrating a plasma processing system 2000 according to example embodiments. The plasma processing system 2000 may include a plasma chamber 210 in which an etching process using plasma is performed, a source supplier 220 disposed at an upper portion of the plasma chamber 210, a substrate holder 230 disposed at a lower portion of the plasma chamber 210 to mount a substrate 100 to be processed, a first RF power supplier 310, a second RF power supplier 320 and a third RF power supplier 330 to provide RF power for generating plasma in the plasma chamber 210, a harmonic control circuit HCC 400 and a controller 501. The plasma chamber 210 is substantially the same as that FIG. 2 and redundant description thereof is omitted.

The first RF power supplier 310 may generate a first RF driving pulse signal RFDP1 including first RF pulses by pulsing a first RF signal SRF1 having a first frequency. The first RF driving pulse signal RFDP1 may be applied to the top electrode 228 and/or the bottom electrode 236.

The second RF power supplier 320 may generate a second RF driving pulse signal RFDP2 including second RF pulses by pulsing a second RF signal SRF2 having a second frequency lower than the first frequency. The second RF driving pulse signal RFDP2 may be applied to the top electrode 228 and/or the bottom electrode 236.

The third RF power supplier 330 may generate a third RF driving pulse signal RFDP3 including third RF pulses by pulsing a third RF signal SRF3 having a third frequency in between the first and second frequencies. The third RF driving pulse signal RFDP3 may be applied to the top electrode 228 and/or the bottom electrode 236.

FIG. 11 illustrates an example in which the first, second and third RF driving pulse signals RFDP1, RFDP2 and RFDP3 are applied to the bottom electrode 236. In other cases, e.g., as described below with reference to FIGS. 16A and 16B, the first to third RF driving pulse signals RFDP1-RFPD3 may each be applied to the top electrode 228 and/or the bottom electrode 236 for delivering RF power to the plasma chamber 210.

The first RF power supplier 310 may include a first signal generator 311, a first pulse switch 312 and a first impedance matching circuit IMC 313; the second RF power supplier 320 may include a second signal generator 321, a second pulse switch 322 and a second impedance matching circuit 323; and the third RF power supplier 330 may include a third signal generator 331, a third pulse switch 332 and a third impedance matching circuit 333.

The first signal generator 311 may include an oscillator to generate the first RF signal SRF1 having the first frequency. The first pulse switch 312 may switch the first RF signal SRF1 in response to a first pulse timing signal SPT1 to generate the first RF driving pulse signal RFDP1 having the first RF pulses. The first impedance matching circuit 313 may match the impedance of the first signal generator 311 providing the first RF driving pulse signal RFDP1 with the impedance of the electrode connected to the first RF power supplier 310 to maximize the transferred power.

The second signal generator 321 may include an oscillator to generate the second RF signal SRF2 having the second frequency lower than the first frequency. The second pulse switch 322 may switch the second RF signal SRF2 in response to a second pulse timing signal SPT2 to generate the second RF driving pulse signal RFDP2 having the second RF pulses. The second impedance matching circuit 323 may match the impedance of the second signal generator 321 providing the second RF driving pulse signal RFDP2 with the impedance of the electrode connected to the second RF power supplier 320 to maximize the transferred power.

The third signal generator 331 may include an oscillator to generate the third RF signal SRF3 having the third frequency lower than the first frequency and higher than the second frequency. The third pulse switch 332 may switch the third RF signal SRF3 in response to a third pulse timing signal SPT3 to generate the third RF driving pulse signal RFDP3 having the third RF pulses. The third impedance matching circuit 333 may match the impedance of the signal third signal generator 331 providing the third RF driving pulse signal RFDP3 with the impedance of the electrode connected to the third RF power supplier 330 to maximize the transferred power.

The first frequency is relatively high for controlling plasma density, and the second frequency and the third frequency are relatively low for controlling ion energy. For example, the first frequency may be higher than 40 MHz, the second frequency may be lower than 600 kHz and the third frequency may be lower than 2 MHz.

The controller 501 may generate a harmonic control signal SHC including harmonic control pulses based on timings of the first RF pulses, the second RF pulses and the third RF pulses. In addition, the controller 501 may generate the first pulse timing signal SPT1 to control the timings of the first RF pulses in the first RF driving pulse signal RFDP1, the second pulse timing signal SPT2 to control the timings of the second RF pulses in the second RF driving pulse signal RFDP2 and the third pulse timing signal SPT3 to control the timings of the third RF pulses in the third RF driving pulse signal RFDP3. Example embodiments of generating the first RF driving pulse signal RFDP1, the second RF driving pulse signal RFDP2, the third RF driving pulse signal RFDP3 and the harmonic control signal SHC will be described below.

The harmonic control circuit 400 may be connected between at least one of the first RF power supplier 310, the second RF power supplier 320 and the third RF power supplier 330 and at least one of the top electrode 228 and the bottom electrode 236. For convenience of illustration, FIG. 11 illustrates an example configuration in which the harmonic control circuit 400 is connected between the bottom electrode 236 and the first, second and third power suppliers 310, 320 and 330.

The harmonic control circuit 400 may be driven based on the harmonic control signal SHC to reduce the harmonic component generated by the first RF driving pulse signal RFDP1 and the second RF driving pulse signal RFDP2. Example embodiments of the harmonic control circuit 400 are the same as described with reference to FIG. 6.

Figure 12:
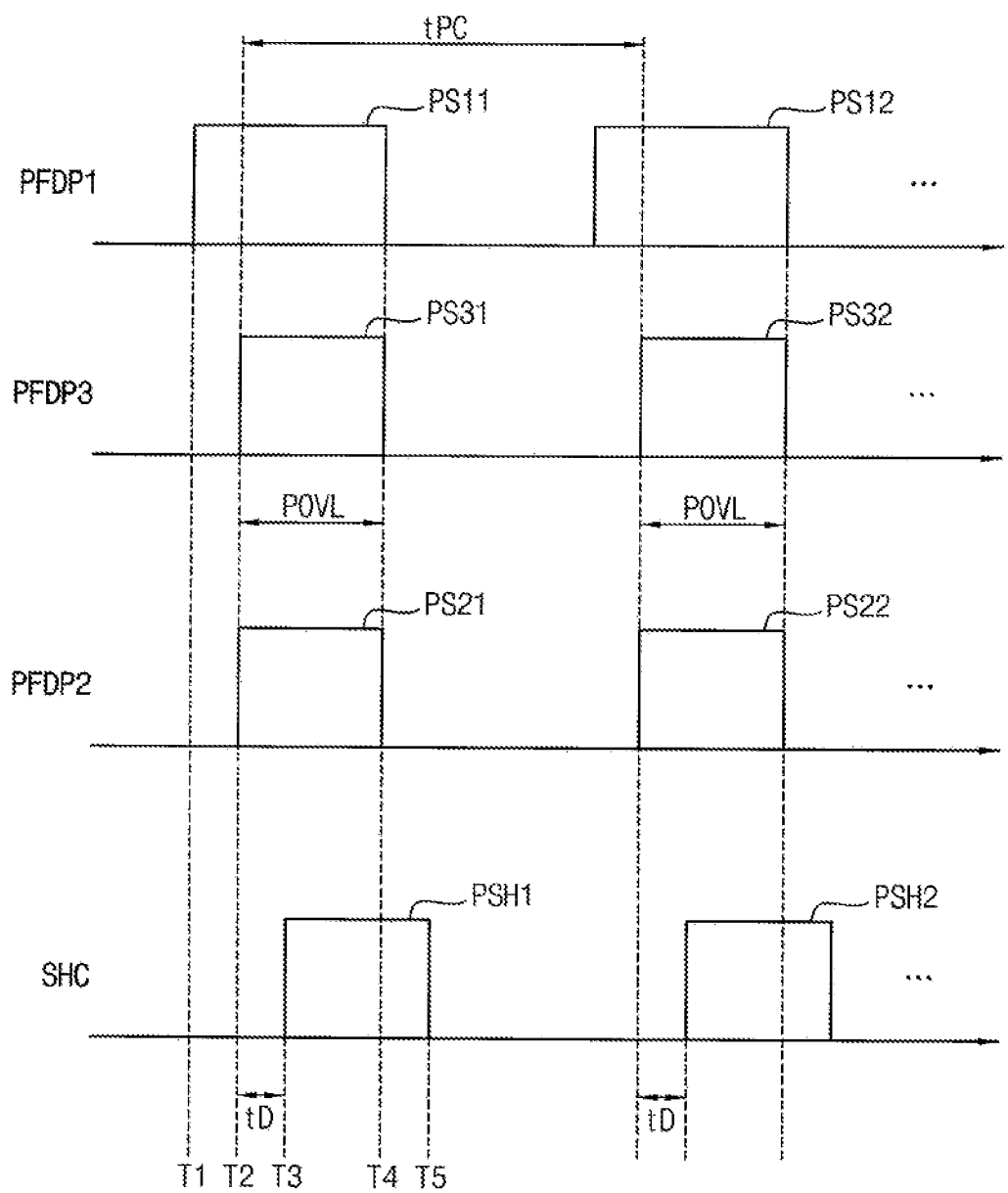
FIG. 12 is a timing diagram illustrating a method of controlling uniformity of plasma according to example embodiments.

FIG. 12 is a timing diagram illustrating a method of controlling uniformity of plasma according to example embodiments. FIG. 12 illustrates example timings of the first, second and third RF driving, pulse signals RFDP1, RFDP2 and RFDP3 and timings of the harmonic control signal SHC based on the timings of the first through third RF driving pulse signals RFDP1, RFDP2 and RFDP3.

Referring to FIGS. 11 and 12, the controller 501 may control the timings of the first through third RF driving pulse signals RFDP1, RFDP2 and RFDP3 such that the first RF pulse PS11 is activated at a time point T1 and deactivated at a time point T4, and the second RF pulse PS21 and the third RF pulse P31 are activated at a time point T2 and deactivated at the time point T4.

In addition, the controller 501 may control the timings of the harmonic control signal SHC such that the harmonic control pulse PSH1 is activated at a time point T3 after a delay time tD from the time point T2 corresponding to a start time point of an overlapping period POVL of the first through third RF pulse PS11, PS21 and PS31. FIG. 12 illustrates that the harmonic control pulse PSH1 is deactivated at a time point T5 after the end time point of the overlapping period POVL, but other deactivation times are available. For example, the harmonic control pulse PSH1 may be deactivated at the time point T4 when the first RF pulse through third PS11, PS21 and PS31 are deactivated.

The first RF pulses PS11 and PS12, the second RF pulses PS21 and PS22, the third RF pulses PS31 and PS32 and the harmonic control pulses PSH1 and PSH2 may have an equal pulse repetition frequency, that is, an equal pulse cyclic period tPC. Accordingly, the timing relation between the first RF pulse PS12, the second RF pulse PS22, and the third RF pulse PS32 and the harmonic control pulse PSH2 may be the same as the timing relation between the first RF pulse PS11, the second RF pulse PS21, the third RF pulse P31 and the harmonic control pulse PSH1. In some example embodiments, the pulse frequency 1/tPC may be higher than 500 Hz and lower than 5 kHz.

The delay time tD may be set to be longer than a plasma saturation time for which the plasma caused by the first RF pulses PS11 and PS12, the second RF pulses PS21 and PS22 and the third RF pulses PS31 and PS32 in the plasma chamber 210 is saturated. In some example embodiments, the delay time tD may be longer than 5 μs.

As such, the harmonic control signal SHC including the harmonic control pulses PSH1 and PSH2 may be generated based on the timings of the first RF pulses PS11 and PS12, the second RF pulses PS21 and PS22 and the third RF pulses PS31 and PS32, for example, by activating the harmonic control pulses PSH1 and PSH2 alter the delay time tD from the start time points T2 of the overlapping periods POVL of the first RF pulses PS11 and PS12, the second RF pulses PS21 and PS22 and the third RF pulses PS31 and PS32.

Figure 13:
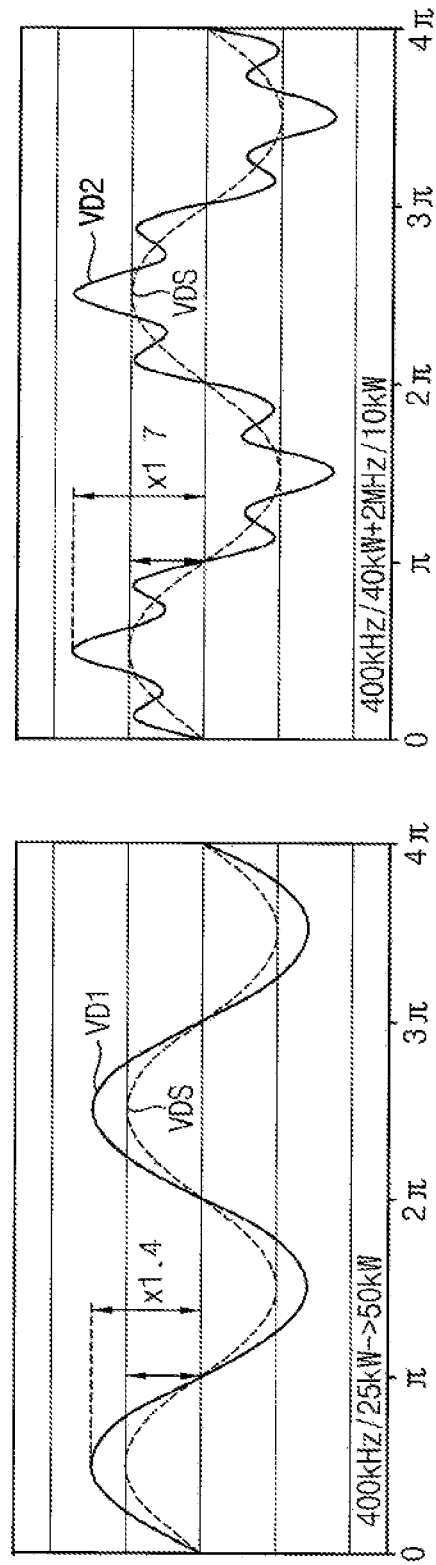
FIG. 13 is a diagram illustrating an enhanced efficiency through use of dual bias power.

FIG. 13 is a diagram illustrating an enhanced efficiency through use of "dual bias power". Here, dual bias power refers to RF power transferred by the second RF driving pulse signal RFDP2 and the third RF driving pulse signal RFDP3 for controlling the ion energy of the plasma. In the discussion hereafter, "single bias" refers to embodiments with just the first and second RF driving pulse signals.

In FIG. 13, VDS indicates an RF supply voltage when only the second RF driving pulse signal RFDP2 having the second frequency of 400 kHz and power of 25 kW is applied, and VD1 indicates an RF supply voltage when only the second RF driving pulse signal RFDP2 having the second frequency of 400 kHz and power of 50 kW is applied. VD2 indicates an RF supply voltage when the second RF driving pulse signal RFDP2 having the second frequency of 400 kHz and power of 40 kW and the third RF driving pulse signal RFDP3 having the third frequency of 2 MHz and power of 10 kW are used as the dual bias case.

Comparing VD1 and VD2, the peak voltage of VD1 is increased 1.4 times if the entire power is increased to 50 kW using the single bias frequency, whereas the peak voltage of VD2 is increased 1.7 times if the entire power is increased to 50 kW using the dual bias frequencies. As such, the efficiency of the RF power may be enhanced by using the dual bias frequencies in comparison with the single bias frequency.

Figure 14:
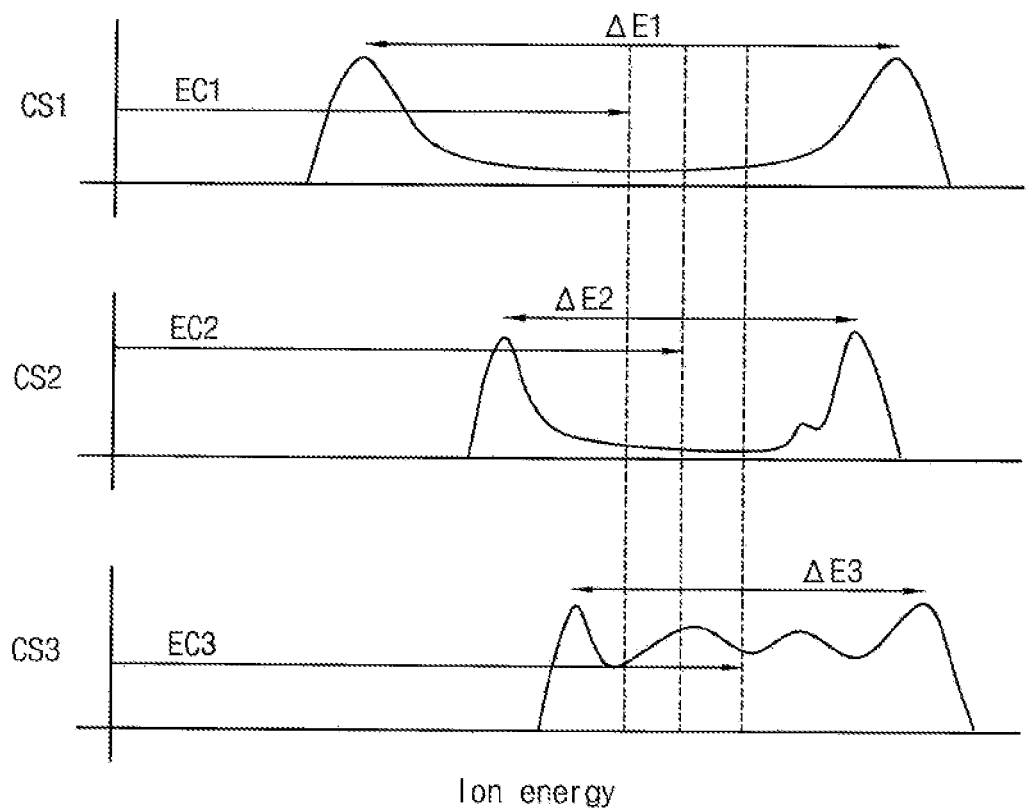
FIG. 14 is a diagram illustrating control of ion energy through use of dual bias power.

FIG. 14 is a diagram illustrating control of ion energy through use of dual bias power. In FIG. 14, the horizontal axis represents ion energy and the vertical axis represents probability density. A first case CS1 is a single bias case that uses a first frequency of 60 MHz and a second frequency of 400 kHz; a second CS2 is a dual bias case using a first frequency of 60 MHz, a second frequency of 400 kHz and a third frequency of 9.8 MHz; and a third case CS3 is a dual bias case using a first frequency of 60 MHz, a second frequency of 400 kHz and a third frequency of 2 MHz. The supplied total power is the same with respect to all of the three cases CS1, CS2 and CS3.

As described with reference to FIG. 13, comparing the first case CS1 corresponding to the single bias frequency and the second case CS2 corresponding to the dual bias frequencies, a center value EC2 and an energy range ΔE2 of the ion energy of the second case CS2 may be improved in comparison with a center value EC1 and an energy range ΔE1 of the ion energy of the first case CS1 as shown in FIG. 14.

Comparing the second case CS2 of using the third frequency of 9.8 MHz as the intermediate frequency and the third case CS3 of using the third frequency of 2 MHz, a center value EC3 and an energy range ΔE3 of the ion energy of the third case CS3 may be further improved as compared to the second case CS2.

In the second case CS2 of using the intermediate frequency of 9.8 MHz, the ion transit time is longer than the RF applying time and thus the distribution of the ion energy is not significantly affected such as in the case of the high (first) frequency. In the third case of using the intermediate frequency of 2 MHz, the ion transit time is similar to or shorter than the RF applying time sufficient to effect the ions in the plasma by the RF voltage and thus the distribution of the ion energy may include peaks in the middle portion of the ion energy range ΔE3.

Figure 15:
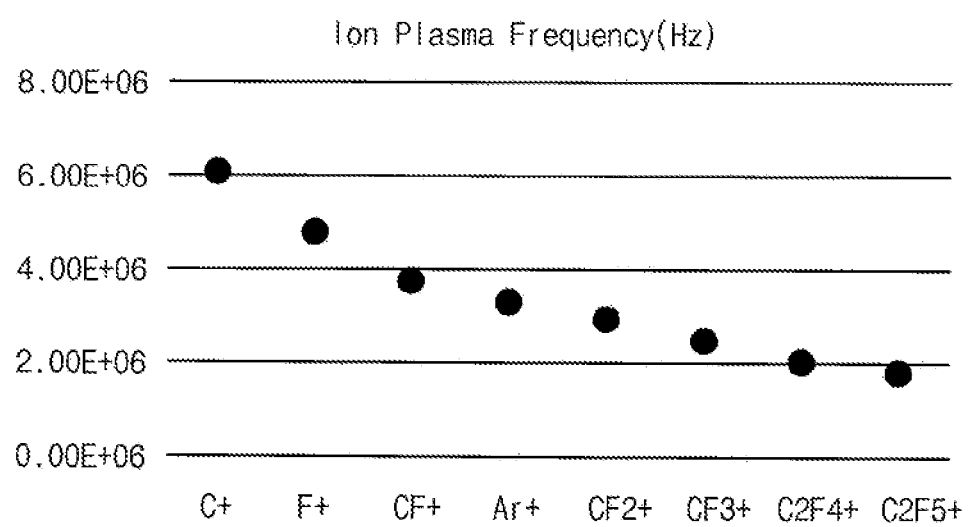
FIG. 15 is a diagram illustrating ion plasma frequencies of ions in plasma.

FIG. 15 is a diagram illustrating ion plasma frequencies of ions in plasma. The diagram shows that the ion plasma frequencies of the ions C+, F=, CF+, Ar+, CF2+, CF3+, C2F4+ and C2F5+ in the plasma are higher than 2 MHz. The ions may be accelerated slowly so as not to acquire sufficient kinetic energy when the RF frequency is relatively high because the ions are heavier than the electrons. The light electrons may be accelerated rapidly to acquire the kinetic energy at the high frequency and thus the high frequency is used as the source frequency to increase the plasma density. In contrast, the higher DC bias voltage is applied by the low frequency and the ion energy may be determined by the DC bias voltage and the RF voltage through the long RF application time. When the ion energy is affected by the RF voltage in the case of the low frequency, the ion energy range becomes wider by the RF voltage varying in real time. Conversely, when the RF voltage does not affect the ion energy so much in case of the high frequency, the ion energy is determined only by the DC bias voltage and the ion energy range may become narrower. The range in which the ion energy may be affected by the RF voltage may be determined by the ion plasma frequency corresponding to the unique frequency of the ion in the plasma. The inverse value of the ion plasma frequency may be represented as the ion transit time, and the ion may receive the energy when the ion transit time is shorter than the RF application time. Accordingly the energy distribution of the third case CS3 may be obtained when an intermediate frequency lower than the ion plasma frequency is used as the above-described third frequency.

As such, the method of controlling uniformity of plasm and the plasma processing system according to example embodiments may improve uniformity of plasma by controlling the ion energy using the efficient frequency combination.

Figure 16A:
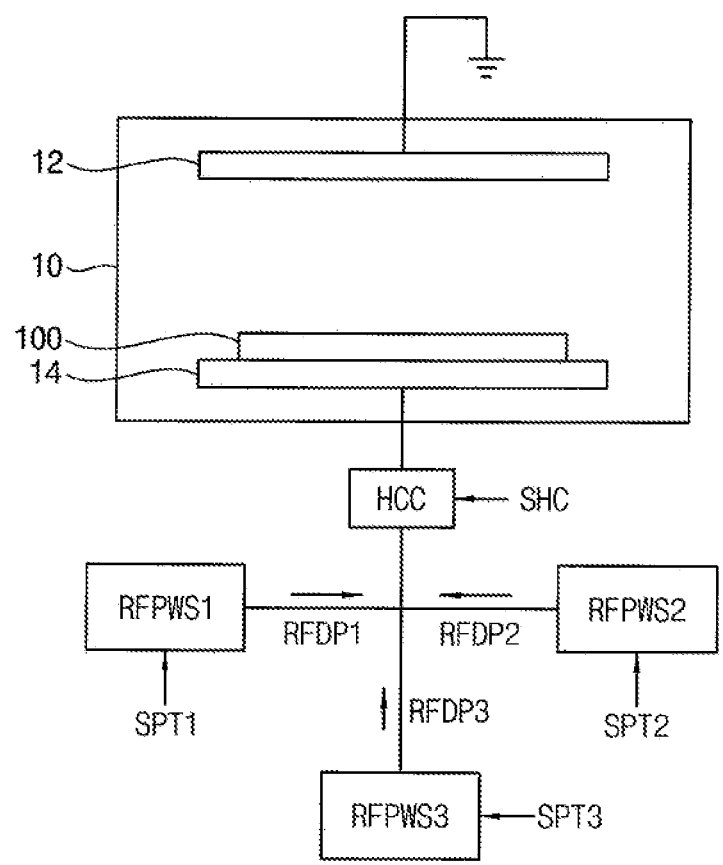
FIGS. 16A and 16B are diagrams illustrating plasma processing systems according to respective embodiments.
Figure 16B:
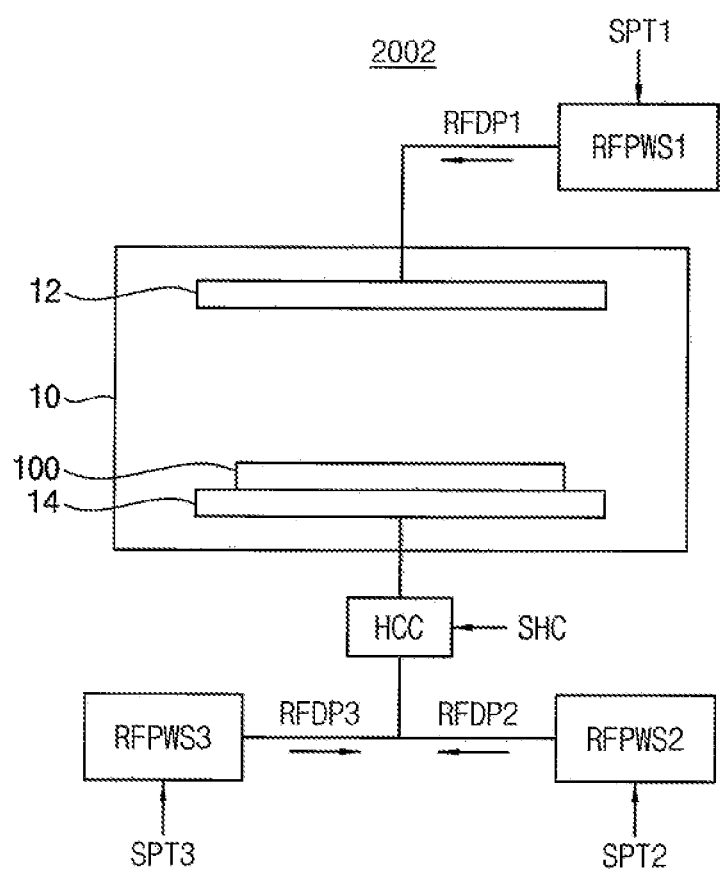

FIGS. 16A and 16B are diagrams illustrating plasma processing systems according to respective embodiments. As shown in FIGS. 16A and 16B, plasma processing systems 2001 and 2002 each include a plasma chamber 10 including a top electrode 12 and a bottom electrode 14 where a wafer or a semiconductor substrate 100 is mounted, to illustrate various example embodiments of connections of a first RF power supplier RFPWS1, a second RF power supplier RFPWS2, a third RF power supplier RFPWS3 and a harmonic control circuit with the electrodes 12 and 14. As described above, the first RF power supplier RFPWS1 may generate the first RF driving pulse signal RFDP1 including the first RF pulses in response to the first pulse timing signal SPT1, the second RF power supplier RFPWS2 may generate the second RF driving pulse signal RFDP2 including the second RF pulses in response to the second pulse timing signal SPT2, the third RF power supplier RFPWS3 may generate the third RF driving pulse signal RFDP3 including the third RF pulses in response to the third pulse timing signal SPT3 and the harmonic control circuit HCC may be enabled in response to the harmonic control signal SHC.

Referring to FIG. 16A, all of the first RF driving pulse signal RFDP1, the second RF driving pulse signal RFDP2 and the third RF driving pulse signal RFDP3 may be applied to the bottom electrode 14 and the harmonic control circuit HCC may be connected between the bottom electrode 14 and the RF power suppliers RFPWS1, RFPWS2 and RFPWS3. The top electrode 12 may be connected to a ground voltage point.

Even though not illustrated in figures, in some example embodiments, all of the first RF driving pulse signal RFDP1, the second RF driving pulse signal RFDP2 and the third RF driving pulse signal RFDP3 may be applied to the top electrode 12 and the harmonic control circuit HCC may be connected between the top electrode 12 and the RF power suppliers RFPWS1, RFPWS2 and RFPWS3. In this case, the bottom electrode 14 may be connected to a ground voltage point.

Referring to FIG. 16B, the first RF driving pulse signal RFDP1 may be applied to the top electrode 12, and the second RF driving pulse signal RFDP2 and the third RF driving pulse signal RFDP3 may be applied to the bottom electrode 14. The harmonic control circuit HCC may be connected between the bottom electrode 14 and the second and third RF power suppliers RFPWS2 and RFPWS3.

In other embodiments (not shown), the first RF driving pulse signal RFDP1 may be applied to the bottom electrode 14, and the second RF driving pulse signal RFDP2 and the third RF driving pulse signal RFDP3 may be applied to the top electrode 12. In this case, the harmonic control circuit HCC may be connected between the top electrode 12 and the second and third RF power suppliers RFPWS2 and RFPWS3.

As described above, methods of controlling uniformity of plasma and the plasma processing system according to example embodiments may improve uniformity of plasma while realizing a desired etching rate by controlling the harmonic wave based on timings of the RF driving pulses. In addition, methods of controlling uniformity of plasma and the plasma processing system according to example embodiments may improve uniformity of plasma by controlling the ion energy using the efficient frequency combination.

The inventive concept may be applied to a variety of semiconductor circuits and manufacturing processes of the semiconductor circuits. For example, the inventive concept may be applied to the manufacturing processes of systems such as a memory card, a solid state drive (SSD), an embedded multimedia card (eMMC), a universal flash storage (UFS), a mobile phone, a smart phone, a personal digital assistant (PDA), a portable multimedia player (PMP), a digital camera, a camcorder, a personal computer (PC), a server computer, a workstation, a laptop computer, a digital TV, a set-top box, a portable game console, a navigation system, a wearable device, an internet of things (IoT) device, an internet of everything (IoE) device, an e-book, a virtual reality (VR) device, an augmented reality (AR) device, etc.

The foregoing is illustrative of example embodiments and is not to be construed as limiting thereof. Although a few example embodiments have been described, those skilled in the art will readily appreciate that many modifications are possible in the example embodiments without materially departing from the present inventive concept.

What is claimed is:

1. A method of controlling uniformity of plasma, comprising:
generating a first radio frequency (RF) driving pulse signal including first RF pulses by pulsing a first RF signal having a first frequency;
generating a second RF driving pulse signal including second RF pulses by pulsing a second RF signal having a second frequency lower than the first frequency;
applying the first RF driving pulse signal and the second RF driving pulse signal to at least one of a top electrode and a bottom electrode of a plasma chamber;
generating a harmonic control signal including harmonic control pulses based on timings of the first RF pulses and the second RF pulses; and
reducing a harmonic component of the first RF driving pulse signal and the second RF driving pulse signal via intermittent activation and deactivation of a harmonic control circuit as controlled by the harmonic control signal.

2. The method of claim 1, wherein generating the harmonic control signal includes:
controlling timings of the harmonic control pulses based on overlapping periods of the first RF pulses and the second RF pulses.

3. The method of claim 2, wherein controlling the timings of the harmonic control pulses includes:
activating the harmonic control pulses after a delay time from start time points of the overlapping periods of the first RF pulses and the second RF pulses.

4. The method of claim 3, wherein the delay time is longer than a plasma saturation time for which plasma caused by the first RF pulses and the second RF pulses in the plasma chamber is saturated.

5. The method of claim 3, wherein the first RF pulses, the second RF pulses and the harmonic control pulses have an equal pulse frequency higher than 500 Hz and lower than 5 kHz, and the delay time is longer than 5 µs.

6. The method of claim 2, wherein controlling the timings of the harmonic control pulses includes:
activating the harmonic control pulses at start time points of the overlapping periods of the first RF pulses and the second RF pulses.

7. The method of claim 2, wherein controlling the timings of the harmonic control pulses includes:
deactivating the harmonic control pulses at end time points of the overlapping periods of the first RF pulses and the second RF pulses.

8. The method of claim 2, wherein activation periods of the second RF pulses are included in activation periods of the first RF pulses.

9. The method of claim 8, wherein controlling the timings of the harmonic control pulses includes:
deactivating the harmonic control pulses at time points when the second RF pulses are deactivated.

10. The method of claim 1, further comprising:
generating a third RF driving pulse signal including third RF pulses by pulsing a third RF signal having a third frequency lower than the first frequency and higher than the second frequency; and
applying the third RF driving pulse signal to at least one of the top electrode and the bottom electrode of the plasma chamber.

11. The method of claim 10, wherein the third frequency is lower than an ion plasma frequency that is a unique frequency of an ion in plasma.

12. The method of claim 10, wherein the first frequency is higher than 40 MHz, the second frequency is lower than 600 kHz and the third frequency is lower than 2 MHz.

13. The method of claim 1, wherein the harmonic control signal is periodically deactivated during a minority portion of pulses of at least one of the first RF driving pulse signal and the second RF driving pulse signal, and is periodically activated during a remaining portion of the pulses of the at least one of the first RF driving pulse signal and the second RF driving pulse signal, and the intermittent activation and deactivation of the harmonic control circuit occurs during corresponding periodic activation and deactivation periods of the harmonic control signal.

14. The method of claim 13, wherein times at which the harmonic control signal is periodically activated coincides with times at which the harmonic component is at a stable level.

15. A plasma processing system, comprising:
a plasma chamber including a top electrode and a bottom electrode;
a first RF power supplier configured to generate a first radio frequency (RF) driving pulse signal including first RF pulses by pulsing a first RF signal having a first frequency to apply the first RF driving pulse signal to at least one of the top electrode and the bottom electrode;
a second RF power supplier configured to generate a second RF driving pulse signal including second RF pulses by pulsing a second RF signal having a second frequency lower than the first frequency to apply the second RF driving pulse signal to at least one of the top electrode and the bottom electrode;
a controller configured to generate a harmonic control signal including harmonic control pulses based on timings of the first RF pulses and the second RF pulses; and
a harmonic control circuit connected between at least one of the first RF power supplier and the second RF power supplier and at least one of the top electrode and the bottom electrode, the harmonic control circuit configured to be driven at time intervals based on the harmonic control signal to reduce a harmonic component of the first RF driving pulse signal and the second RF driving pulse signal.

16. The plasma processing system of claim 15, wherein the controller controls timings of the harmonic control pulses based on overlapping periods of the first RF pulses and the second RF pulses.

17. The plasma processing system of claim 15, further comprising:
a third RF power supplier configured to generate a third RF driving pulse signal including third RF pulses by pulsing a third RF signal having a third frequency lower than the first frequency and higher than the second frequency to apply the RF driving pulse signal to at least one of the top electrode and the bottom electrode.

18. The plasma processing system of claim 15, wherein the harmonic control circuit includes:
a plurality of impedance circuits configured to be electrically connected, in response to a plurality of switch signals, to a path through which the first RF driving pulse signal or the second RF driving pulse signal is transferred; and
a switch controller configured to generate the plurality of switch signals based on the harmonic control signal and a total impedance that is set to reduce the harmonic component.

19. The plasma processing system of claim 15, wherein the first RF pulses, the second RF pulses and the harmonic control pulses have an equal pulse repetition frequency.

20. A method of controlling uniformity of plasma, comprising:
generating a first radio frequency (RF) driving pulse signal including first RF pulses by pulsing a first RF signal having a first frequency;
generating a second RF driving pulse signal including second RF pulses by pulsing a second RF signal having a second frequency lower than the first frequency;
generating a third RF driving pulse signal including third RF pulses by pulsing a third RF signal having a third frequency lower than the first frequency and higher than the second frequency, wherein each of the second frequency and the third frequency is lower than an ion plasma frequency;
applying the first RF driving pulse signal, the second RF driving pulse signal and the third RF driving pulse signal to at least one of a top electrode and a bottom electrode of a plasma chamber;
generating a harmonic control signal including harmonic control pulses based on timings of the first RF pulses, the second RF pulses and the third RF pulses; and
reducing a harmonic component of the first RF driving pulse signal, the second RF driving pulse signal and the third RF driving pulse signal via intermittent activation and deactivation of a harmonic control circuit as controlled by the harmonic control signal.

* * * * *